(12) United States Patent
Saitoh et al.

(10) Patent No.: US 12,315,704 B2
(45) Date of Patent: May 27, 2025

(54) PLASMA PROCESSING APPARATUS, AND METHOD AND PROGRAM FOR CONTROLLING ELEVATION OF FOCUS RING

(71) Applicant: TOKYO ELECTRON LIMITED, Tokyo (JP)

(72) Inventors: Yusuke Saitoh, Miyagi (JP); Tokuhisa Oiwa, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 266 days.

(21) Appl. No.: 17/954,169

(22) Filed: Sep. 27, 2022

(65) Prior Publication Data
US 2023/0013805 A1 Jan. 19, 2023

Related U.S. Application Data

(62) Division of application No. 16/156,384, filed on Oct. 10, 2018, now abandoned.

(30) Foreign Application Priority Data

Oct. 11, 2017 (JP) ................................ 2017-197313

(51) Int. Cl.
*H01J 37/32* (2006.01)
*H01L 21/67* (2006.01)
(Continued)

(52) U.S. Cl.
CPC ........ *H01J 37/32642* (2013.01); *H01J 37/32* (2013.01); *H01J 37/32091* (2013.01);
(Continued)

(58) Field of Classification Search
CPC ......... H01L 21/67069; H01L 21/67253; H01L 21/67259; H01L 21/6831; H01L 21/6833;
(Continued)

(56) References Cited

U.S. PATENT DOCUMENTS 4,328,553 A * 5/1982 Fredriksen ........... B28D 5/0082
125/35
5,213,658 A * 5/1993 Ishida ............... H01J 37/32697
427/571
(Continued)

FOREIGN PATENT DOCUMENTS

CN 107086168 A 8/2017
JP 2002-176030 A 6/2002
(Continued)

OTHER PUBLICATIONS

"http://www.silicon-wafer.co.jp/semispec.htm" captured by WayBackMachine archive on Dec. 5, 2001 (Year: 2001).

*Primary Examiner* — Kurt Sweely
(74) *Attorney, Agent, or Firm* — XSENSUS LLP

(57) ABSTRACT

A plasma processing apparatus includes a mounting table, an acquisition unit, a calculation unit, and an elevation control unit. The mounting table mounts thereon a target object as a plasma processing target. The elevation mechanism vertically moves a focus ring surrounding the target object. The acquisition unit acquires state information indicating a measured state of the target object. The calculation unit calculates a height of the focus ring at which positional relation between an upper surface of the target object and an upper surface of the focus ring satisfies a predetermined distance based on the state of the target object that is indicated by the state information acquired by the acquisition unit. The elevation control unit controls the elevation mechanism to vertically move the focus ring to the height calculated by the calculation unit.

18 Claims, 18 Drawing Sheets

(51) Int. Cl.
*H01L 21/683* (2006.01)
*H01L 21/687* (2006.01)

(52) U.S. Cl.
CPC .. *H01J 37/32724* (2013.01); *H01L 21/67069* (2013.01); *H01L 21/67253* (2013.01); *H01L 21/67259* (2013.01); *H01L 21/6831* (2013.01); *H01L 21/6833* (2013.01); *H01L 21/68735* (2013.01); *H01L 21/68742* (2013.01); *H01J 2237/21* (2013.01); *H01J 2237/2446* (2013.01); *H01J 2237/24495* (2013.01); *H01J 2237/24578* (2013.01); *H01J 2237/334* (2013.01); *H01L 21/67103* (2013.01); *H01L 21/67109* (2013.01); *H01L 21/67248* (2013.01)

(58) Field of Classification Search
CPC ......... H01L 21/68742; H01L 21/67103; H01L 21/67109; H01L 21/67248; H01J 37/32642; H01J 37/32091; H01J 37/32724
See application file for complete search history.

(56) References Cited

U.S. PATENT DOCUMENTS

| | | | | |
|---|---|---|---|---|
| 5,900,064 | A * | 5/1999 | Kholodenko | H01L 21/6831 438/758 |
| 6,726,799 | B2 * | 4/2004 | Koike | H01J 37/32642 118/712 |
| 8,298,371 | B2 * | 10/2012 | Koshimizu | H01J 37/32091 156/345.47 |
| 2002/0072240 | A1 | 6/2002 | Koike | |
| 2003/0201069 | A1 * | 10/2003 | Johnson | H01J 37/32082 156/345.43 |
| 2004/0035529 | A1 * | 2/2004 | Grimbergen | H01L 21/67253 156/345.24 |
| 2004/0149389 | A1 * | 8/2004 | Fink | H01J 37/32642 156/345.51 |
| 2008/0258082 | A1 * | 10/2008 | Okumura | H01J 37/32642 250/492.3 |
| 2010/0025369 | A1 * | 2/2010 | Negishi | H01J 37/32642 216/60 |
| 2014/0209245 | A1 * | 7/2014 | Yamamoto | H01L 21/6831 361/234 |
| 2014/0339684 | A1 * | 11/2014 | Mollart | C23C 16/4585 257/632 |
| 2015/0168130 | A1 * | 6/2015 | Matsudo | G01B 9/02021 374/161 |
| 2016/0211165 | A1 | 7/2016 | Mcchesney et al. | |
| 2018/0315640 | A1 * | 11/2018 | Ueda | H01L 21/67248 |

FOREIGN PATENT DOCUMENTS

| | | |
|---|---|---|
| JP | 2002-261084 A | 9/2002 |
| JP | 2003229408 A | 8/2003 |
| JP | 2016-146472 A | 8/2016 |

* cited by examiner

FIG. 9

| WAFER SIZE | | 2" | 3" | 4" | 5" | 6" | 8" | 12" |
|---|---|---|---|---|---|---|---|---|
| DIAMETER (mm) | JEITA | 50±0.5 | 76±0.5 | 100±0.2 | 125±0.2 | 150±0.2 | 200±0.5 | 300±0.2 |
| | SEMI | 50.8±0.38 | 76.2±0.63 | 100±0.5 | 125±0.5 | 150±0.2 | 200±0.2 | 300±0.2 |
| THICKNESS (μm) | JEITA | 280±10 | 380±15 | 525±15 | 625±15 | 625±15 | 725±25 | 775±25 |
| | SEMI | 279±25 | 381±25 | 520±20 | 625±20 | 675±20 | 725±20 | 775±20 |

FIG. 10A
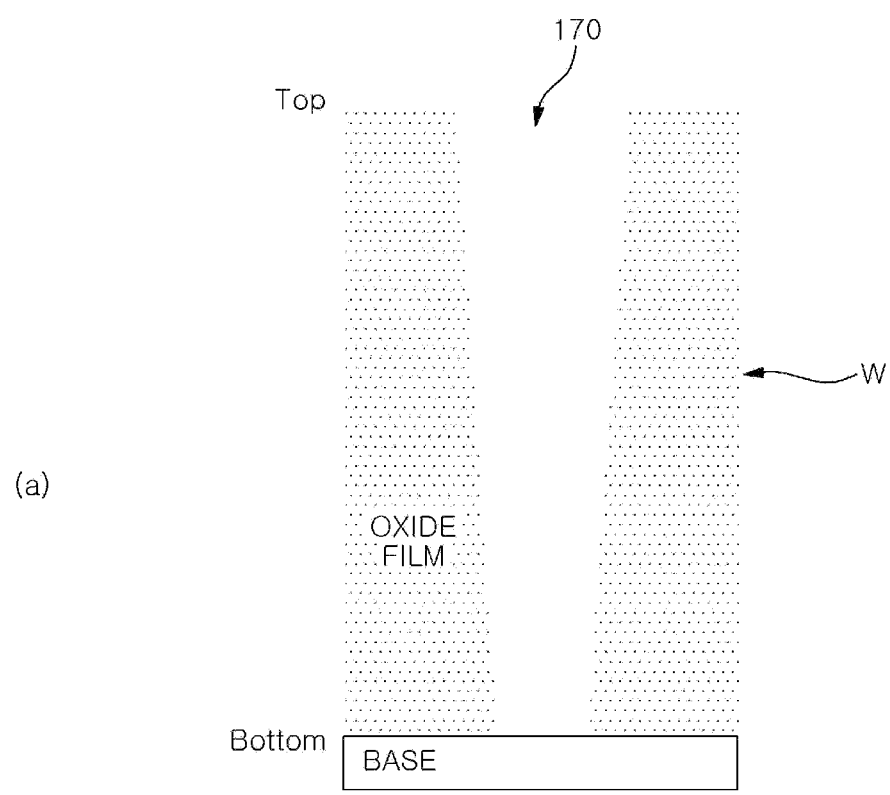
(a)
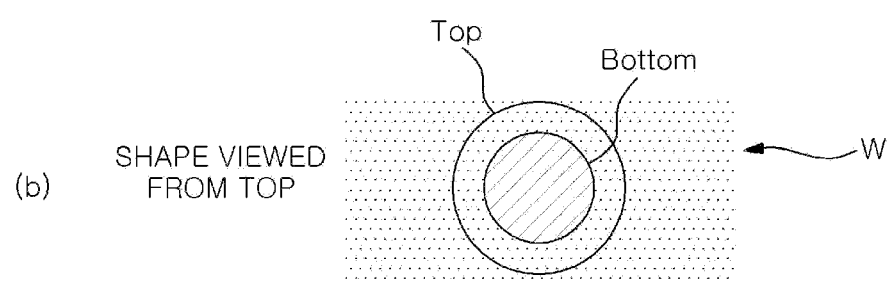
(b)

PLASMA PROCESSING APPARATUS, AND METHOD AND PROGRAM FOR CONTROLLING ELEVATION OF FOCUS RING

CROSS-REFERENCE TO RELATED APPLICATIONS

This application is a continuation application of U.S. application Ser. No. 16/156,384, filed Oct. 10, 2018, which claims priority to Japanese Patent Application No. 2017-197313 filed Oct. 11, 2017, the entire contents of which are incorporated herein by reference and priority is claimed to each.

FIELD OF THE INVENTION

The present disclosure relates to a plasma processing apparatus, and a method and program for controlling elevation of a focus ring.

BACKGROUND OF THE INVENTION

Conventionally, there is known a plasma processing apparatus for performing plasma processing such as etching or the like on a target object such as a semiconductor wafer (hereinafter, also referred to as "wafer") or the like by using plasma. In this plasma processing apparatus, when plasma processing is performed, components in a chamber are consumed. For example, a focus ring, which is provided to surround the wafer to make plasma uniform, may be close to the plasma and thus is consumed quickly. The degree of consumption of the focus ring greatly affects a result of processing on the wafer. For example, when a height position of a plasma sheath above the focus ring is deviated from a height position of a plasma sheath above the wafer, etching characteristics in an outer peripheral portion of the wafer deteriorate, which affects etching uniformity or the like.

Therefore, in the plasma processing apparatus, when the focus ring is consumed to a certain extent, the focus ring is replaced (see, e.g., Japanese Patent Application Publication No. 2016-146472). Further, there has been proposed a technique for raising the focus ring by a drive mechanism so that heights of the wafer and the focus ring can be maintained at the same level (see, e.g., Japanese Patent Application Publication No. 2002-176030).

However, even when the focus ring is driven to replace the focus ring or maintain the heights of the wafer and the focus ring at the same level, etching characteristics may vary depending on wafers.

Although a wafer size is determined based on the standards, a diameter, a thickness and the like may vary within the standards. Therefore, in the plasma processing apparatus, etching characteristics of wafers may vary due to the variation in wafer states. Particularly, a peripheral portion of a wafer is easily affected by the variation in the wafer state.

SUMMARY OF THE INVENTION

In accordance with an aspect, there is provided a plasma processing apparatus including a mounting table, an acquisition unit, a calculation unit, and an elevation control unit. The mounting table mounts thereon a target object as a plasma processing target. The elevation mechanism vertically moves a focus ring surrounding the target object. The acquisition unit acquires state information indicating a measured state of the target object. The calculation unit calculates a height of the focus ring at which positional relation between an upper surface of the target object and an upper surface of the focus ring satisfies a predetermined distance based on the state of the target object that is indicated by the state information acquired by the acquisition unit. The elevation control unit controls the elevation mechanism to vertically move the focus ring to the height calculated by the calculation unit.

BRIEF DESCRIPTION OF THE DRAWINGS

The objects and features of the present disclosure will become apparent from the following description of embodiments, given in conjunction with the accompanying drawings, in which:

FIG. 9 shows wafer sizes;

FIGS. 10A and 10B schematically show a state in which a hole is etched;

DETAILED DESCRIPTION OF THE EMBODIMENTS

Figure 1:
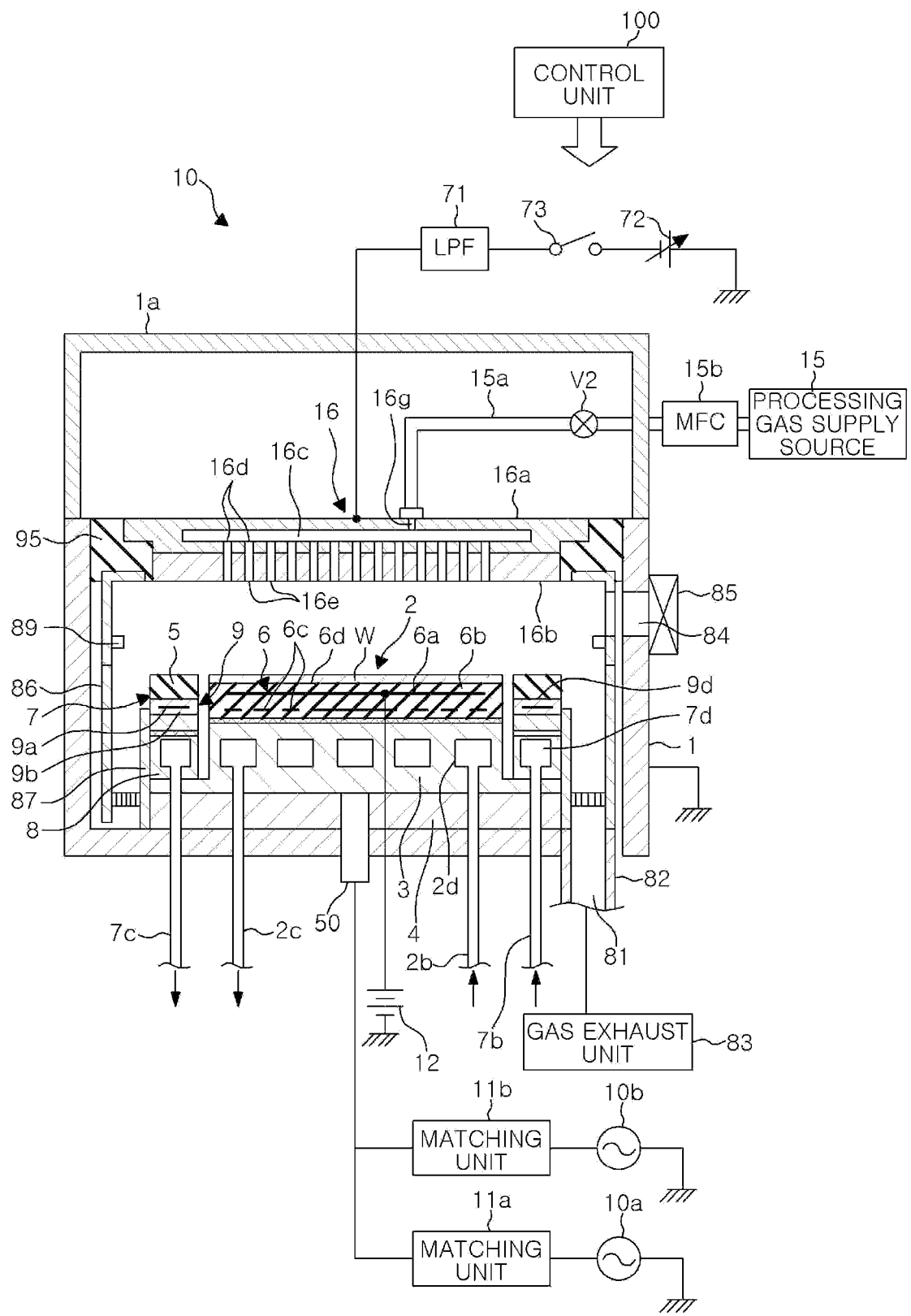
FIG. 1 is a schematic cross sectional view showing a schematic configuration of a plasma processing apparatus according to a first embodiment.

Hereinafter, embodiments of a plasma processing apparatus of the present disclosure will be described in detail with reference to the accompanying drawings. Like reference numerals will be given to like or corresponding parts throughout the drawings. The embodiments are not intended to limit the present disclosure. The embodiments can be appropriately combined without contradicting processing contents.

First Embodiment

<Configuration of Plasma Processing Apparatus>

First, a schematic configuration of a plasma processing apparatus 10 according to a first embodiment will be described. FIG. 1 is a schematic cross sectional view showing a schematic configuration of the plasma processing apparatus. The plasma processing apparatus 10 includes an airtight processing chamber 1 that is electrically grounded. The processing chamber 1 is formed in a cylindrical shape and made of, e.g., aluminum having an anodically oxidized surface. The processing chamber 1 defines a processing space where plasma is generated. A first mounting table 2 for horizontally supporting a wafer W as a work-piece is provided in the processing chamber 1.

The first mounting table 2 has a substantially cylindrical shape with upper and lower surfaces directed vertically. The upper surface of the first mounting table 2 serves as a mounting surface 6d. The mounting surface 6d of the first mounting table 2 is substantially the same size as the wafer W. The first mounting table 2 includes a base 3 and an electrostatic chuck (ESC) 6.

The base 3 is made of a metal, e.g., aluminum having an anodically oxidized surface or the like. The base 3 serves as a lower electrode. The base 3 is supported by a supporting member 4 made of an insulator. The supporting member 4 is installed at a bottom portion of the processing chamber 1.

The electrostatic chuck 6 has a flat disc-shaped upper surface serving as the mounting surface 6d on which the wafer W is mounted. The electrostatic chuck 6 is provided at a central portion of the first mounting table 2 when seen from the top. The electrostatic chuck 6 includes an electrode 6a and an insulator 6b. The electrode 6a is embedded in the insulator 6b. A DC power supply 12 is connected to the electrode 6a. The wafer W is attracted and held on the electrostatic chuck 6 by a Coulomb force generated by applying a DC voltage from the DC power supply 12 to the electrode 6a. A heater 6c is provided in the insulator 6b of the electrostatic chuck 36. The heater 6c controls a temperature of the wafer W by a power supplied through a power supply mechanism (not shown).

A second mounting table 7 is provided around an outer peripheral surface of the first mounting table 2. The second mounting table 7 is formed in a cylindrical shape whose inner diameter is greater than an outer diameter of the first mounting table 2 by a predetermined value. The first mounting table 2 and the second mounting table 7 are coaxially arranged. The second mounting table 7 has an upper surface serving as a mounting surface 9d on which an annular focus ring (F/R) 5 is mounted. The focus ring 5 is made of, e.g., single crystalline silicon, and mounted on the second mounting table 7.

The second mounting table 7 includes a base 8 and a focus ring heater unit 9. The base 8 is made of a conductive metal similar to that of the base 3. The base 8 is made of, e.g., aluminum having an anodically oxidized surface or the like. A lower portion of the base 3 which faces the supporting member 4 is greater in a diametrical direction than an upper portion of the base 3 and extends in a flat plate shape to a position below the second mounting table 7. The base 8 is supported by the base 3. The focus ring heater unit 9 is supported by the base 8. The focus ring heater unit 9 has an annular shape with a flat upper surface serving as a mounting surface 9d on which the focus ring 5 is mounted. The focus ring heater unit 9 includes a heater 9a and an insulator 9b. The heater 9a is embedded in the insulator 9b. A power is supplied to the heater 9a through a power supply mechanism (not shown) to control a temperature of the focus ring 5. In this manner, the temperature of the wafer W and the temperature of the focus ring 5 are independently controlled by different heaters.

A power feed rod 50 for supplying RF (Radio Frequency) power is connected to the base 3. The power feed rod 50 is connected to a first RF power supply 10a via a first matching unit 11a and connected to a second RF power supply 10b via a second matching unit 11b. The first RF power supply 10a generates power for plasma generation. A high frequency power having a predetermined frequency is supplied from the first RF power supply 10a to the base 3 of the first mounting table 2. The second RF power supply 10b generates power for ion attraction (bias). A high frequency power having a predetermined frequency lower than that from the first RF power supply 10a is supplied from the second RF power supply 10b to the base 3 of the first mounting table 2.

A coolant path 2d is formed in the base 3. The coolant path 2d has one end connected to a coolant inlet line 2b and the other end connected to a coolant outlet line 2c. A coolant path 7d is formed in the base 8. The coolant path 7d has one end connected to a coolant inlet line 7b and the other end connected to a coolant outlet line 7c. The coolant path 2d is positioned below the wafer W and absorbs heat of the wafer W. The coolant path 7d is positioned below the focus ring 5 and absorbs heat of the focus ring 5. In the plasma etching apparatus 10, temperatures of the first mounting table 2 and the second mounting table 7 can be individually controlled by circulating a coolant, e.g., cooling water or the like, through the coolant path 2d and the coolant path 7d, respectively. Further, the plasma etching apparatus 10 may be configured such that a cold heat transfer gas is supplied to a backside of the wafer W and to a bottom surface of the focus ring 35 to separately control the temperatures thereof. For example, a gas supply line for supplying a cold heat transfer gas (backside gas) such as He gas or the like to the backside of the wafer W may be provided to penetrate through the first mounting table 2 and the like. The gas supply line is connected to a gas supply source. With this configuration, the wafer W attracted and held by the electrostatic chuck 6 on the top surface of the first mounting table 2 can be controlled to a predetermined temperature.

A shower head 16 serving as an upper electrode is provided above the first mounting table 2 to face the first mounting table 2 in parallel therewith. The shower head 16 and the first mounting table 2 function as a pair of electrodes (upper electrode and lower electrode).

The shower head 16 is provided at a ceiling wall portion of the processing chamber 1. The shower head 16 includes a main body 16a and an upper ceiling plate 16b serving as an electrode plate. The shower head 16 is supported at an upper portion of the processing chamber 1 through an insulating member 95. The main body 16a is made of a conductive material, e.g., aluminum having an anodically oxidized surface. The upper ceiling plate 16b is detachably held at a bottom portion of the main body 16a.

A gas diffusion space 16c is formed in the main body 16a. A plurality of gas holes 16d is formed in the bottom portion of the main body 16a to be positioned below the gas diffusion space 16c. Gas injection holes 16e are formed through the upper ceiling plate 16b in a thickness direction thereof. The gas injection holes 16e communicate with the respective gas holes 16d. With this configuration, the processing gas supplied to the gas diffusion space 16c is distributed in a shower form into the processing chamber 1 through the gas holes 16d and the gas injection holes 16e.

A gas inlet port 16g for introducing the processing gas into the gas diffusion space 16c is formed in the main body 16a. One end of a gas supply line 15a is connected to the gas inlet port 16g and the other end of the gas supply line 15a is connected to a processing gas supply source 15 for supplying a processing gas. A mass flow controller (MFC) 15b and an opening/closing valve V2 are disposed in the gas supply line 15a in that order from an upstream side. The processing gas for plasma etching is supplied from the processing gas supply source 15 to the gas diffusion space 16c through the gas supply line 15a and distributed in a shower form into the processing chamber 1 through the gas holes 16d and the gas injection holes 16e.

A variable DC power supply 72 is electrically connected to the shower head 16 serving as the upper electrode via a low pass filter (LPF) 71. A power supply of the variable DC power supply 72 is on-off controlled by an on/off switch 73. Current/voltage of the variable DC power supply 72 and on/off of the on/off switch 73 are controlled by a control unit 100 to be described later. As will be described later, when plasma is generated in the processing space by applying the high frequency power from the first and the second RF power supply 10a and 10b to the first mounting table 2, the on/off switch 73 is turned on by the control unit 100 and a predetermined DC voltage is applied to the shower head 16 serving as the upper electrode, if necessary.

A cylindrical ground conductor 1a extends upward from a sidewall of the processing chamber 1 to a position higher than a height of the shower head 16. The cylindrical ground conductor 1a has a ceiling wall at the top thereof.

A gas exhaust port 81 is formed at a bottom portion of the processing chamber 1. A gas exhaust unit 83 is connected to the gas exhaust port 81 through a gas exhaust line 82. The gas exhaust unit 83 has a vacuum pump. By operating the vacuum pump, a pressure in the processing chamber 1 can be decreased to a predetermined vacuum level. A loading/unloading port 84 for the wafer W is provided at a sidewall of the processing chamber 1. A gate valve 85 for opening/closing the loading/unloading port 84 is provided at the loading/unloading port 84.

A deposition shield 86 is provided along an inner surface of the sidewall of the processing chamber 1. The deposition shield 86 prevents etching by-products (deposits) from being attached to the inner surface of the processing chamber 1. A conductive member (GND block) 89 is provided at a portion of the deposition shield 86 at substantially the same height as the height of the wafer W. The conductive member 89 is connected such that a potential for the ground can be controlled. Due to the presence of the conductive member 89, abnormal discharge is prevented. A deposition shield 87 extending along the first mounting table 2 is provided to correspond to a lower portion of the deposition shield 86. The deposition shields 86 and 87 are detachably provided.

The operation of the plasma processing apparatus 10 configured as described above is integrally controlled by the control unit 100 (or controller). The control unit 100 (or controller) is, e.g., a computer, and controls the respective components of the plasma processing apparatus 10.

<Configuration of First Mounting Table and Second Mounting Table>

Figure 2:
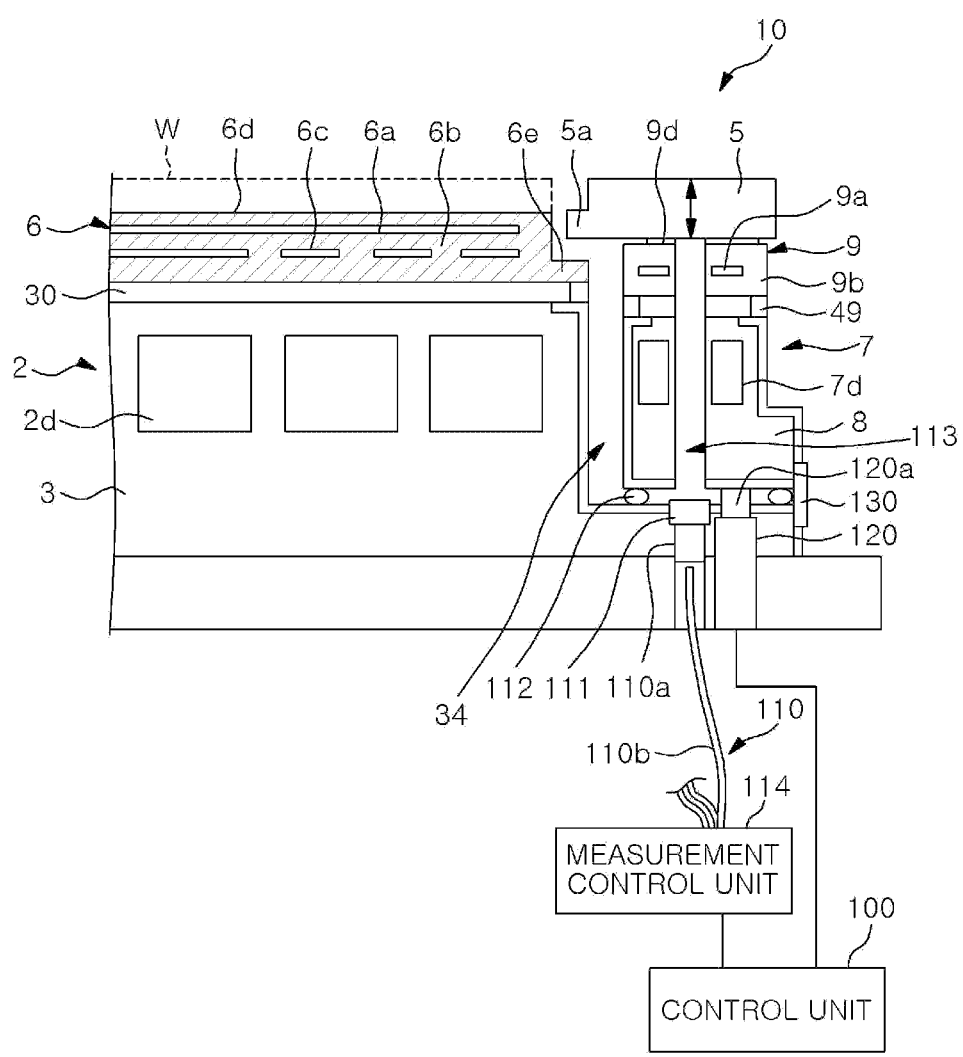
FIG. 2 is a schematic cross sectional view showing configurations of main parts of a first mounting table and a second mounting table.

The configurations of main parts of the first mounting table 2 and the second mounting table 7 according to the first embodiment will be described with reference to FIG. 2. FIG. 2 is a schematic cross sectional view showing the configuration of the main parts of the first mounting table and the second mounting table according to the first embodiment.

The first mounting table 2 includes a base 3 and an electrostatic chuck 6. The electrostatic chuck 6 is adhered to the base 3 through an insulating layer 30. The electrostatic chuck 6 is formed in a disc shape and provided coaxially with respect to the base 3. In the electrostatic chuck 6, an electrode 6a is provided in an insulator 6b. The upper surface of the electrostatic chuck 6 serves as the mounting surface 6d on which the wafer W is mounted. A flange portion 6e projecting outwardly in a radial direction of the electrostatic chuck 6 is formed at a lower end of the electrostatic chuck 6. In other words, the electrostatic chuck 6 has different outer diameters depending on positions of the side surface.

In the electrostatic chuck 6, the heater 6c is provided in the insulator 6b. The coolant path 2d is formed in the base 3. The coolant path 2d and the heater 6c function as a temperature control mechanism for controlling the temperature of the wafer W. The heater 6c may not be provided in the insulator 6b. For example, the heater 6c may be adhered to the lower surface of the electrostatic chuck 6 or may be interposed between the mounting surface 6d and the coolant path 2d. Further, a single heater 6c may be provided for the entire mounting surface 6d or may be provided for each of a plurality of divided regions of the mounting surface 6d. In other words, a plurality of heaters 6c may be provided for the respective divided regions of the mounting surface 6d. For example, the heater 6c may extend in an annular shape about the center of the first mounting table 2 in each of a plurality of regions concentrically arranged. Alternatively, the heater may include a heater for heating a central region and a heater extending in an annular shape to surround the central region. The heater 6c may be provided in each of a plurality of regions obtained by radially dividing the region extending in an annular shape about the center of the mounting surface 6d.

Figure 3:
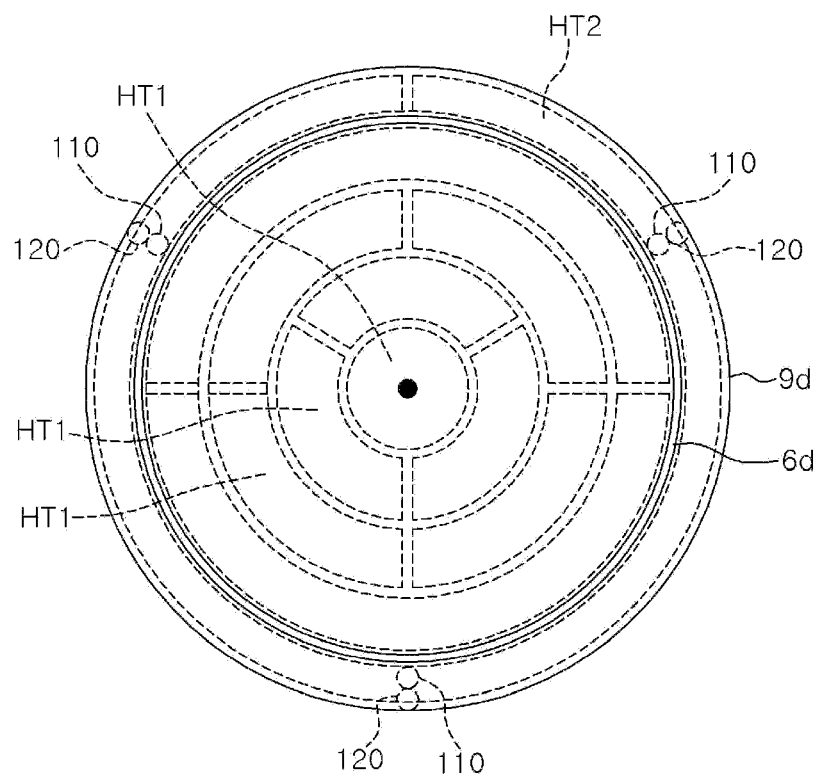
FIG. 3 is a top view of the first mounting table and the second mounting table which is viewed from the top.

FIG. 3 is a top view of the first mounting table and the second mounting table which is viewed from the top. Referring to FIG. 3, the mounting surface 6d of the first mounting table 2 has a disc shape. The mounting surface 6d is divided into a plurality of regions HT1 depending on a distance and a direction from the center. The heater 6c is provided in each of the regions HT1. Accordingly, the plasma processing apparatus 10 can control a temperature of the wafer W in each of the regions HT1.

Referring back to FIG. 2, the second mounting table 7 includes the base 8 and the focus ring heater unit 9. The base 8 is supported by the base 3. In the focus ring heater unit 9, the heater 9a is provided in the insulator 9b. The coolant path 7d is formed in the base 8. The coolant path 7d and the heater 9a function as a temperature control mechanism for controlling a temperature of the focus ring 5. The focus ring heater unit 9 is adhered to the base 8 through an insulating layer 49. An upper surface of the focus ring heater unit 9 serves as the mounting surface 9d on which the focus ring 5 is mounted. A sheet member having high thermal conductivity or the like may be provided on the upper surface of the focus ring heater unit 9.

The focus ring 5 that is an annular member is provided coaxially with respect to the second mounting table 7. A protruding portion 5a is protruded in a radial direction from an inner side surface of the focus ring 5. In other words, the focus ring 5 has different inner diameters depending on positions of the inner side surface thereof. For example, an inner diameter of a portion of the focus ring 5 where the protruding portion 5a is not formed is greater than an outer diameter of the wafer W and an outer diameter of the flange portion 6e of the electrostatic chuck 6. On the other hand, an inner diameter of a portion of the focus ring 5 where the protruding portion 5a is formed is smaller than the outer diameter of the flange portion 6e of the electrostatic chuck 6 and greater than an outer diameter of a portion of the electrostatic chuck 6 where the flange portion 6e is not formed.

The focus ring 5 is disposed on the second mounting table 7 in a state where the protruding portion 5a is separated from an upper surface of the flange portion 6e of the electrostatic chuck 6 and also separated from a side surface of the electrostatic chuck 6. In other words, a gap is formed between a lower surface of the protruding portion 5a of the focus ring 5 and the upper surface of the flange portion 6e of the electrostatic chuck 6. In addition, a gap is formed between a side surface of the protruding portion 5a of the focus ring 5 and a side surface where the flange portion 6e of the electrostatic chuck 6 is not formed. The protruding portion 5a of the focus ring 5 is located above a gap 34 between the base 3 of the first mounting table 2 and the base 8 of the second mounting table 7. In other words, when viewed from a direction perpendicular to the mounting surface 6d, the protruding portion 5a overlaps with the gap 34 and covers the gap 34. Accordingly, it is possible to suppress inflow of the plasma into the gap 34.

The heater 9a has an annular shape coaxial with the base 8. A single heater 9a may be provided for the entire mounting surface 9d or may be provided for each of a plurality of divided regions of the mounting surface 9d. In other words, a plurality of heaters 9a may be provided for the respective divided regions of the mounting surface 9d. For example, the heater 9a may be provided in each of a plurality of regions obtained by circumferentially dividing the mounting surface 9d of the second mounting table 7. For example, in FIG. 3, the mounting surface 9d of the second mounting table 7 is provided around the disc-shaped mounting surface 6d of the first mounting table 2. The mounting surface 9d is circumferentially divided into a plurality of regions HT2, and the heater 9a is provided in each of the regions HT2. Accordingly, the plasma processing apparatus 10 can control a temperature of the focus ring 5 in each of the regions HT2.

Referring back to FIG. 2, the plasma processing apparatus 10 is provided with a measuring unit 110 for measuring a height of the upper surface of the focus ring 5. In the present embodiment, the measuring unit 110 constitutes an optical interferometer for measuring a distance by using interference of laser light. The measuring unit 110 includes a light emitting part 110a and an optical fiber 110b. A light emitting part 110a is provided at the first mounting table 2 to be positioned below the second mounting table 7. A quartz window 111 for shielding vacuum is provided at an upper portion of the light emitting part 110a. An O-ring 112 for shielding vacuum is provided between the first mounting table 2 and the second mounting table 7. A hole 113 penetrating through the second mounting table 7 to the upper surface thereof is formed at a position corresponding to the position where the measuring unit 110 is provided. A member that transmits laser light may be provided at the hole 113.

The light emitting part 110a is connected to a measurement control unit 114 through the optical fiber 110b. The measurement control unit 114 has therein a light source for generating laser light for measurement. The laser light generated by the measurement control unit 114 is emitted from the light emitting part 110a through the optical fiber 110b. The laser light emitted from the light emitting part 110a is partially reflected by the quartz window 111 or the focus ring 5. The reflected laser light is incident on the light emitting part 110a.

Figure 4:
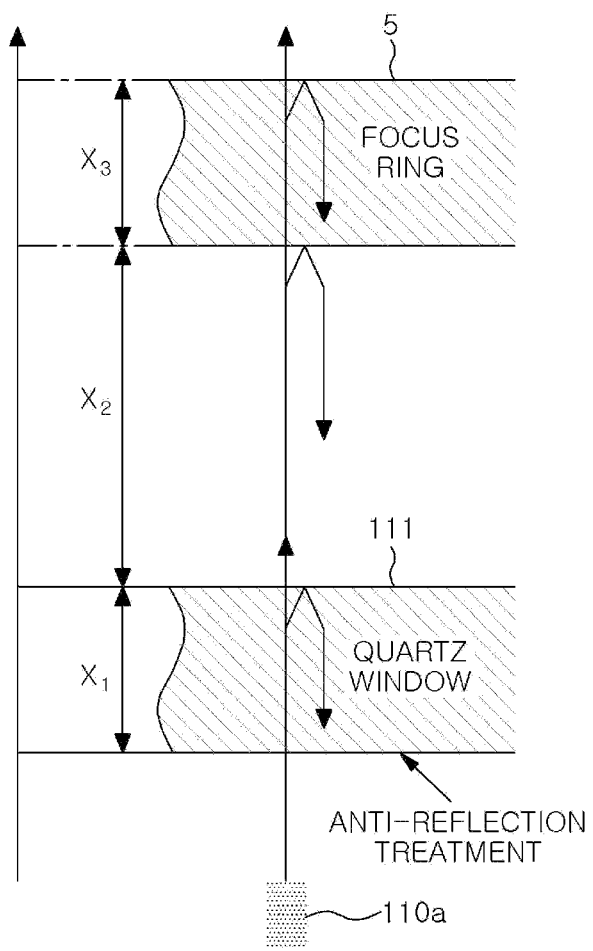
FIG. 4 shows a reflection system of laser light.

FIG. 4 shows a reflection system of laser light. A surface of the quartz window 111 which faces the light emitting part 110a is subjected to anti-reflection treatment and, thus, the reflection of the laser light on that surface is reduced. As shown in FIG. 4, a part of the laser light emitted from the light emitting part 110a is mainly reflected on the upper surface of the quartz window 111, the lower surface of the focus ring 5 and the upper surface of the focus ring 5, and incident on the light emitting part 110a.

The light incident on the light emitting part 110a is guided to the measurement control unit 114 through the optical fiber 110b. The measurement control unit 114 has therein a spectrometer or the like and measures a distance based on the interference state of the reflected laser light. For example, the measurement control unit 114 detects an intensity of light for each mutual distance between reflective surfaces based on the interference state of the incident laser light.

Figure 5:
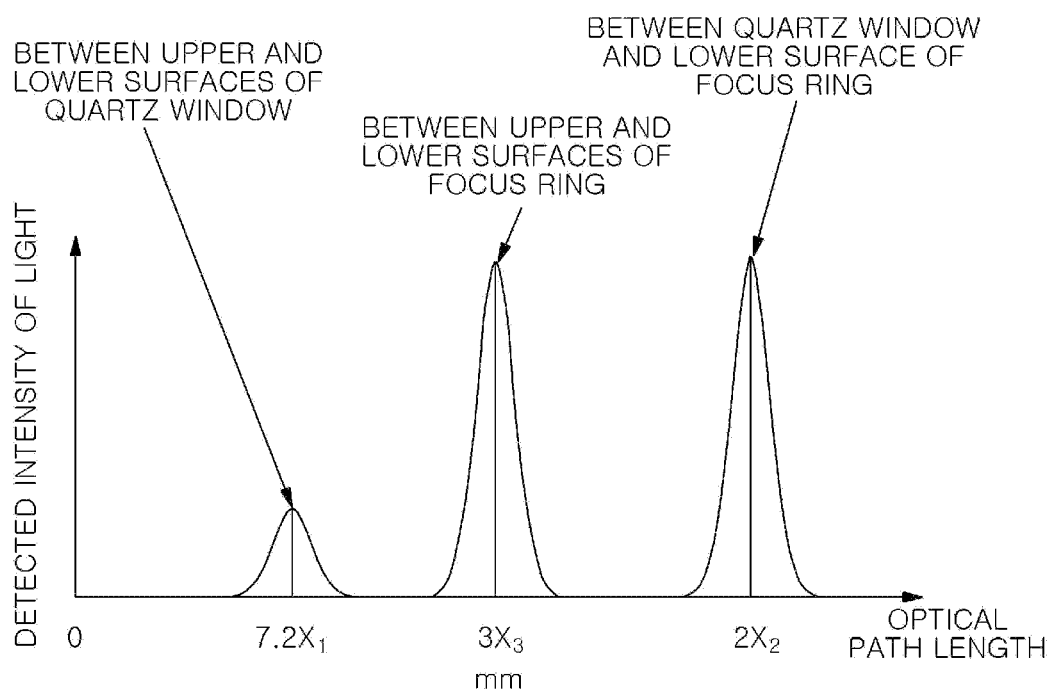
FIG. 5 shows an example of distribution of detected intensities of the light.

FIG. 5 shows an example of distribution of detected intensities of light. The measurement control unit 114 detects the intensity of the light while setting a mutual distance between the reflective surfaces as an optical path length. The horizontal axis in the graph of FIG. 5 represents the mutual distance set as the optical path length. "0" on the horizontal axis represents the origin of all mutual distances. The vertical axis in the graph of FIG. 5 represents the detected intensity of the light. The optical interferometer measures the mutual distance from the interference state of the reflected light. In the reflection, the light reciprocates the optical path of the mutual distance. Therefore, the optical path length is measured by "mutual distance×2×refractive index". For example, when a thickness of the quartz window 111 is $X_1$ and the refractive index of quartz is 3.6, the optical path length to the upper surface of the quartz window 111 from the lower surface of the quartz window 111 is calculated as $X_1 \times 2 \times 3.6 = 7.2X_1$. In the example shown in FIG. 5, the intensity of the light reflected on the upper surface of the quartz window 111 has a peak at an optical path length of $7.2X_1$. When a thickness of the hole 113 is $X_2$ and the refractive index of the hole 113 where air exists is 1.0, the optical path length to the lower surface of the focus ring 5 from the upper surface of the quartz window 111 is calculated as $X_2 \times 2 \times 1.0 = 2X_2$. In the example shown in FIG. 5, the intensity of the light reflected on the lower face of the focus ring 5 has a peak at an optical path length of $2X_2$. When a thickness of the focus ring 5 made of silicon is $X_3$ and the refractive index of the focus ring 5 is 1.5, the optical path length to the upper surface of the focus ring 5 from the lower surface of the focus ring 5 is calculated as $X_3 \times 2 \times 1.5 = 3X_3$. In the example shown in FIG. 5, the intensity of the light reflected on the upper surface of the focus ring 5 has a peak at an optical path length of $3X_3$.

The thickness and the material of a new focus ring 5 are known. The thickness and the refractive index of the material of the new focus ring 5 are registered in the measurement control unit 114. The measurement control unit 114 calculates an optical path length corresponding to the thickness and the refractive index of the material of the new focus ring 5 and measures the thickness of the focus ring 5 from a peak position of the light having the peak intensity near the calculated optical path length. For example, the measurement control unit 114 measures the thickness of the focus ring 5 from the peak position of the light having the peak intensity near the optical path length of $3X_3$. The measurement control unit 114 adds all mutual distances between reflective surfaces to the upper surface of the focus ring 5 and measures the height of the upper surface of the focus ring 5. The measurement control unit 114 outputs the measurement result to the control unit 100. Further, the measurement control unit 114 may output the thickness of the focus ring 5 as the measurement result to the control unit 100. The thickness of the focus ring 5 may be measured by the control unit 100. For example, the measurement control unit 114 measures the optical path length corresponding to the peak of the detected intensity and outputs the measurement result to the control unit 100. The thickness and the refractive index of the material of the new focus ring 5 are registered in the control unit 100. The control unit 100 may calculate the optical path length corresponding to the thickness and the refractive index of the material of the new focus ring 5 and measure the thickness of the focus ring 5 from the peak position of the light having the peak intensity near the calculated optical path length.

Referring back to FIG. 2, an elevation mechanism 120 for vertically moving the second mounting table 7 is provided at the first mounting table 2. For example, the elevation mechanism 120 is provided at the first mounting table 2 to be positioned below the second mounting table 7. The elevation mechanism 120 has therein an actuator and vertically moves the second mounting table 7 by extending/contracting a rod 120a by using driving force of the actuator. The elevation mechanism 120 may obtain driving force for extending/contracting the rod 120a by converting the driving force of the motor by a gear or the like or may obtain driving force for extending/contracting the rod 120a by a hydraulic pressure or the like.

The second mounting table 7 is configured not to be affected even when it is moved up. For example, each of the coolant inlet line 7b and the coolant outlet line 7c is configured as a flexible line or a mechanism that can supply a coolant even when the second mounting table 7 is vertically moved. The wiring for supplying power to the heater 9a is configured as a flexible wiring or a mechanism that is electrically connected even when the second mounting table 7 is vertically moved.

In addition, the first mounting table 2 is provided with a conducting part 130 electrically connected to the second mounting table 7. The conducting part 130 is configured to electrically connect the first mounting table and the second mounting table 7 even when the second mounting table 7 is vertically moved by the elevation mechanism 120. For example, the conducting part 130 is configured as a flexible wiring or a mechanism that is electrically connected by contact between a conductor and the base 8 even when the second mounting table 7 is vertically moved. The conducting part 130 is provided so that the second mounting table 7 and the first mounting table 2 have equal electrical characteristics. For example, a plurality of conducting parts 130 is provided on a circumferential surface of the first mounting table 2. The RF power supplied to the first mounting table 2 is also supplied to the second mounting table 7 through the conducting part 130. Alternatively, the conducting part 130 may be provided between the upper surface of the first mounting table 2 and the lower surface of the second mounting table 7.

The measuring unit 110 and the elevation mechanism 120 are arranged at a plurality of positions in the circumferential direction of the focus ring 5. In the plasma processing apparatus 10 of the present embodiment, three pairs of the measuring unit 110 and the elevation mechanism 120 are provided. For example, the pairs of the measuring unit 110 and the elevation mechanism 120 are arranged on the second mounting table 7 at a regular interval in a circumferential direction of the second mounting table 7. FIG. 3 shows arrangement positions of the measuring units 110 and the elevation mechanisms 120. The measuring unit 110 and the elevation mechanism 120 are disposed at the same position on the second mounting table 7 at an interval of 120° in the circumferential direction of the second mounting table 7. Four or more pairs of the measuring unit 110 and the elevation mechanism 120 may be provided on the second mounting table 7. Further, the measuring unit 110 and the elevation mechanism 120 may be separated in the circumferential direction of the second mounting table 7. Further, the measuring unit 110 and the elevation mechanism 120 may be disposed apart from the circumferential direction of the second mounting table 7.

The measurement control unit 114 measures the thickness of the focus ring 5 at the positions of the measuring units 110 and outputs the measurement result to the control unit 100.

<Configuration of Control Unit>

Figure 6:
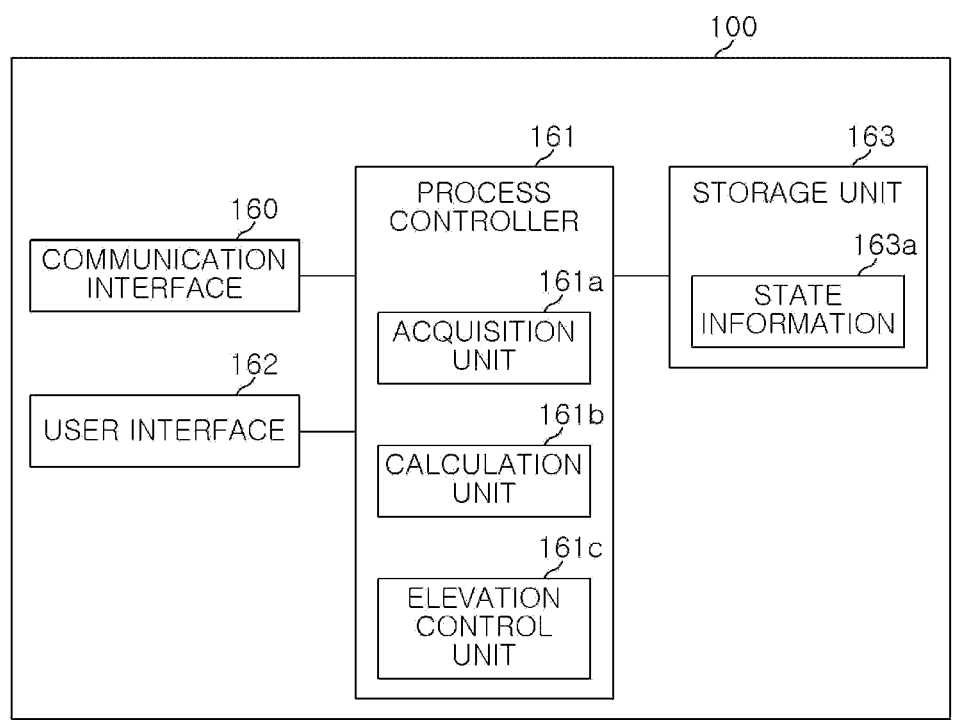
FIG. 6 is a block diagram showing a schematic configuration of a control unit for controlling the plasma processing apparatus according to the first embodiment.

Next, the control unit 100 will be described in detail. FIG. 6 is a block diagram showing a schematic configuration of the control unit for controlling the plasma processing apparatus according to the first embodiment. The control unit 100 includes a communication interface 160, a process controller 161, a user interface 162, and a storage unit 163.

The communication interface 160 can communicate with other devices via a network, and transmits and receives various data to and from other devices.

The process controller 161 has a CPU (Central Processing Unit) and controls the respective components of the plasma processing apparatus 10.

The user interface 162 includes a keyboard through which a process manager inputs commands to operate the plasma processing apparatus 10, a display for visualizing an operation status of the plasma processing apparatus 10, and the like.

The storage unit 163 stores therein recipes including a control program (software), processing condition data and the like for realizing various processes performed by the plasma processing apparatus 10 under the control of the process controller 161. For example, state information 163a is stored in the storage unit 163. The recipes including the control program, the processing condition data and the like can be stored in a computer-readable storage medium (e.g., a hard disk, an optical disk such as DVD or the like, a flexible disk, a semiconductor memory, or the like) or can be transmitted, when needed, from another apparatus through, e.g., a dedicated line, and used on-line.

The state information 163a is data in which the state of the wafer W as a plasma processing target is stored. For example, the state information 163a includes a thickness of the wafer W which is measured at a plurality of positions in the circumferential direction of the wafer W. In a transfer system in which the wafer W is transferred to the plasma processing apparatus 10, the state of the wafer W is measured in an apparatus before the plasma processing apparatus 10. For example, the wafer W passes through an alignment apparatus before it is transferred to the plasma processing apparatus 10. The alignment apparatus is provided with a horizontal rotation stage and can control various alignment operations such as control of a rotation position of the wafer W and the like.

The alignment apparatus measures the state of the wafer such as a thickness and an outer diameter of the wafer W at a plurality of positions in the circumferential direction of the wafer W. The state of the wafer W is measured at the position corresponding to the arrangement positions of the measuring unit 110 and the elevation mechanism 120 in the case where the wafer W is mounted on the first mounting table 2. The state information including the state of the wafer such as the thickness and the outer diameter at each position in the circumferential direction of the wafer W is stored as the state information 163a in the storage unit 163 via a network.

The process controller 161 has an internal memory for storing program or data, reads out the control program stored in the storage unit 163, and executes processing of the read-out control program. The process controller 161 functions as various processing units by executing the control program. For example, the process controller 161 has functions of an acquisition unit 161a, a calculation unit 161b, and an elevation control unit 161c. In the plasma processing apparatus 10 of the present embodiment, the case in which the process controller 161 has the functions of the acquisition unit 161a, the calculation unit 161b and the elevation control unit 161c will be described as an example. However, the functions of the acquisition unit 161a, the calculation unit 161b and the elevation control unit 161c may be distributed to a plurality of controllers and realized.

In the plasma processing apparatus 10, when the plasma processing is performed, the focus ring 5 is consumed and the thickness of the focus ring 5 is reduced. When the thickness of the focus ring 5 is reduced, a height position of a plasma sheath above the focus ring 5 is deviated from a height position of a plasma sheath above the wafer W deviates and, thus, the etching characteristics are changed.

Figure 7A:
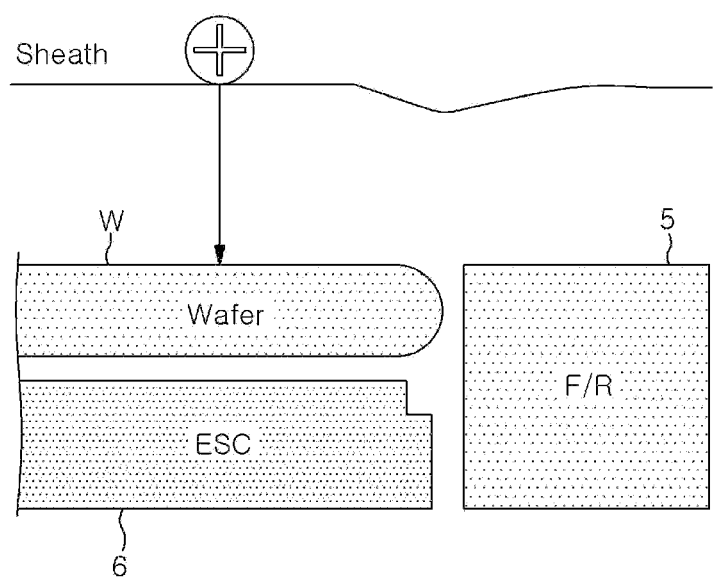
FIG. 7A schematically shows an ideal state of a plasma sheath.

FIG. 7A schematically shows an ideal state of the plasma sheath. For example, as shown in FIG. 7A, when the height of the plasma sheath is aligned above the focus ring 5 and the wafer W, positive charges of ions are vertically incident on the wafer W.

Figure 7B:
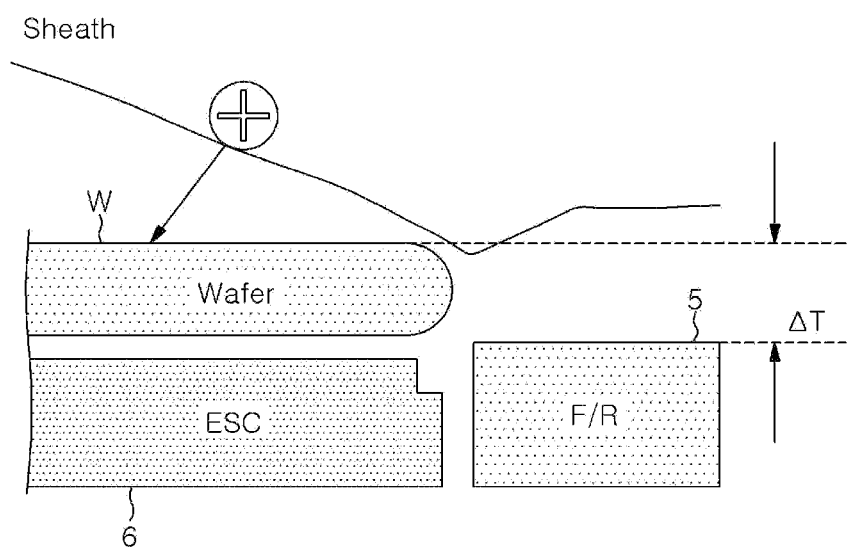
FIG. 7B schematically shows a state of the plasma sheath in the case where a focus ring is consumed.

When the focus ring 5 is consumed, the etching characteristics are changed. FIG. 7B schematically shows the state of the plasma sheath in the case where the focus ring is consumed. As shown in FIG. 7B, when the height of the plasma sheath above the focus ring 5 is lower than that above the wafer W, the plasma sheath is inclined at the peripheral portion of the wafer W, and positive charges of ions are obliquely incident on the wafer W at the peripheral portion of the wafer W. When the incident angle of the positive charges of the ions is changed, the etching characteristics are changed. For example, shape abnormality such as tilting occurs in a hole being etched. The tilting is abnormality in which a hole is obliquely etched.

Figure 8A:
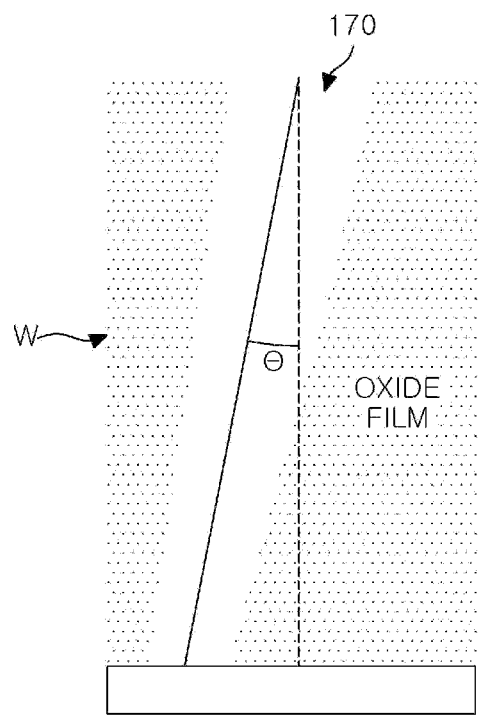
FIG. 8A schematically shows an example of tilting of a hole.
Figure 8B:
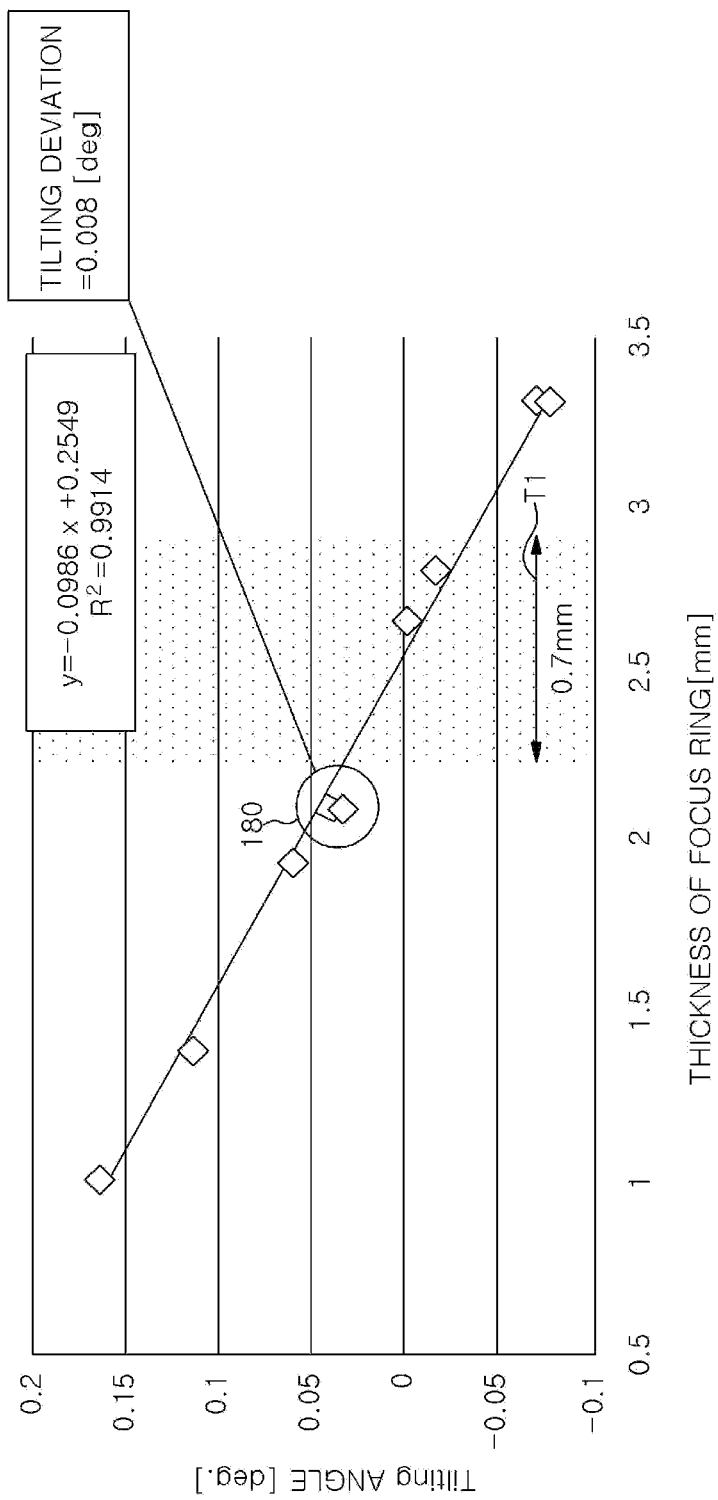
FIG. 8B shows an example of the relation between an angle θ of an etched hole and a thickness of a focus ring.

FIG. 8A schematically shows an example of the tilting of a hole. FIG. 8A shows a cross sectional shape of a hole 170 etched in an oxide film of the wafer W. The hole 170 is obliquely etched at an angle θ with respect to the vertical direction of the wafer W. When the angle θ is not 0°, the tilting occurs in the hole 170. For example, in the plasma processing apparatus 10, when the height of the second mounting table 7 is constant, the angle θ of the hole to be etched varies depending on the thickness of the focus ring 5. FIG. 8B shows an example of the relation between the angle θ of the hole to be etched and the thickness of the focus ring. FIG. 8B shows the angle of the hole e (tilting angle θ) measured in the case of performing etching while varying the thickness of the focus ring 5 and maintaining the height of the second mounting table 7 at a constant level. FIG. 8B shows the tilting angle θ with respect to the thickness of the focus ring 5. In the example shown in FIG. 8B, as the thickness of the focus ring 5 is increased from around 1.75 mm, the tilting angle θ is increased in a negative direction.

Further, as the thickness of the focus ring 5 is decreased from around 1.75 mm, the tilting angle θ is increased in a positive direction. For example, when a hole is etched in a state where the tilting angle θ is within a range of −0.05 [deg]≤θ≤+0.05 [deg], the thickness of the focus ring 5 needs to be within a usable range T1 shown in FIG. 8B.

Even when the thickness of the focus ring 5 is constant, the etching characteristics may vary depending on wafers W. For example, referring to FIG. 8B, as indicated by a reference numeral 180, two tilting angles θ are plotted at the thickness of the focus ring 5 of 2.1 mm. The two tilting angles θ were measured by etching holes in two different wafers W, respectively. There is a difference of 0.008 [deg] between the two tilting angles θ indicated by the reference numeral 180.

Although the size of the wafer W is determined based on the standards, a certain error is allowed. FIG. 9 shows wafer sizes. FIG. 9 shows the range of the diameter and the thickness for each wafer size according to the standards of JEITA (Japan Electronics and Information Technology Industries Association) and SEMI. As described above, the standard diameter and the standard thickness of the wafer W are determined for each wafer size, and the standard value may have a certain tolerance. Therefore, even if the wafer W is within the standards, the wafer state has an error in a diameter, a thickness or the like. If there is an error in the wafer state, the angle θ of the etched hole may be different depending on wafers W.

Figure 10B:
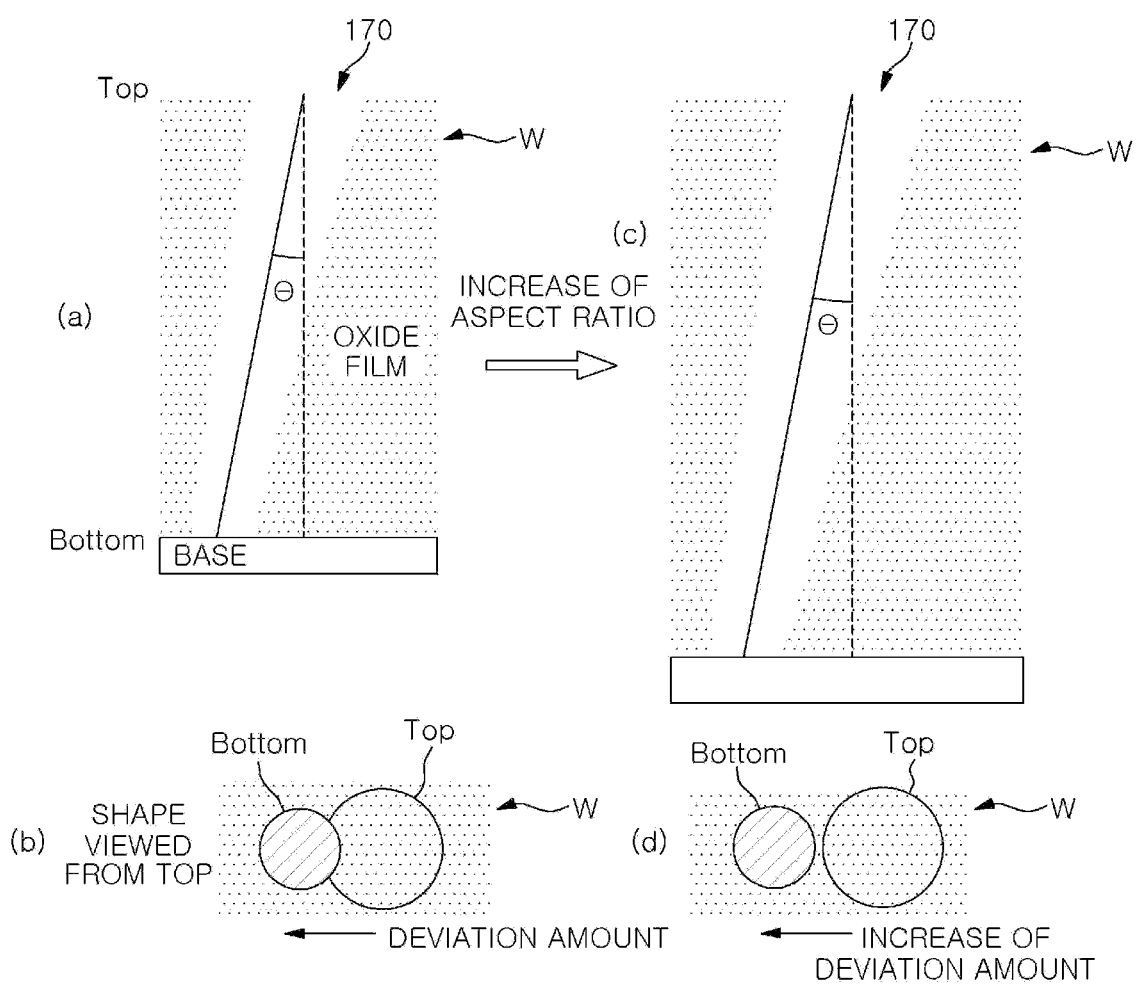

FIG. 10A schematically shows a state in which a hole is etched. FIG. 10A shows an ideal state in which the hole 170 is vertically etched in the oxide film of the wafer W. FIG. 10A shows a cross sectional shape of the hole 170 etched in the oxide film. FIG. 10B shows a position (Top) of the hole 170 on a top surface of the oxide film and a position (Bottom) of the hole 170 on a bottom surface thereof in the case where the etched hole 170 is viewed from the top. When the hole 170 is etched in an ideal state, the position of the hole 170 on the top surface coincides with the position of the hole 170 on the bottom surface as can be seen from FIG. 10B.

FIG. 10B schematically shows a state in which a hole is etched. FIG. 10B shows a state in which the hole 170 is obliquely etched at an angle θ in the oxide film. (a) of FIG. 10B shows a cross sectional shape of the hole 170 etched in the oxide film. (b) of FIG. 10B shows a position (Top) of the hole 170 on the top surface of the oxide film and a position (Bottom) of the hole 170 on the bottom surface thereof in the case where the etched hole 170 is viewed from the top. When the hole 170 is etched obliquely, the position of the hole 170 on the top surface is deviated from the position of the hole 170 on the bottom surface, as can be seen from (b) of FIG. 10B.

Recently, in the plasma processing apparatus 10, the etching of a hole having a high aspect ratio is required. For example, in manufacturing a NAND flash memory having a three-dimensional structure, a hole to be etched has a high aspect ratio. However, when the aspect ratio of the hole to be etched is high, the positional deviation caused by the angle θ of the hole is increased.

(c) and (d) of FIG. 10B show a state in which a hole having a high aspect ratio is obliquely etched at an angle θ in a thicker oxide film. (c) of FIG. 10B shows a cross sectional shape of the hole 170 etched in the oxide film. (d) of FIG. 10B shows a position (Top) of the hole 170 on the top surface of the oxide film and a position (Bottom) of the hole 170 on the bottom surface thereof in the case where the etched hole 170 is viewed from the top. When the aspect ratio of the hole is high, the deviation amount between the position of the hole 170 on the top surface and the position of the hole 170 on the bottom surface is increased, as can be seen from (d) of FIG. 10B.

In the plasma processing apparatus 10, as the hole to be etched becomes deeper and the aspect ratio of the hole becomes higher, the changes in the etching characteristics due to the variation in the state of the wafer W become remarkable. Particularly, the peripheral portion of the wafer W is easily affected by the variation in the state of the wafer W.

Figure 11A:
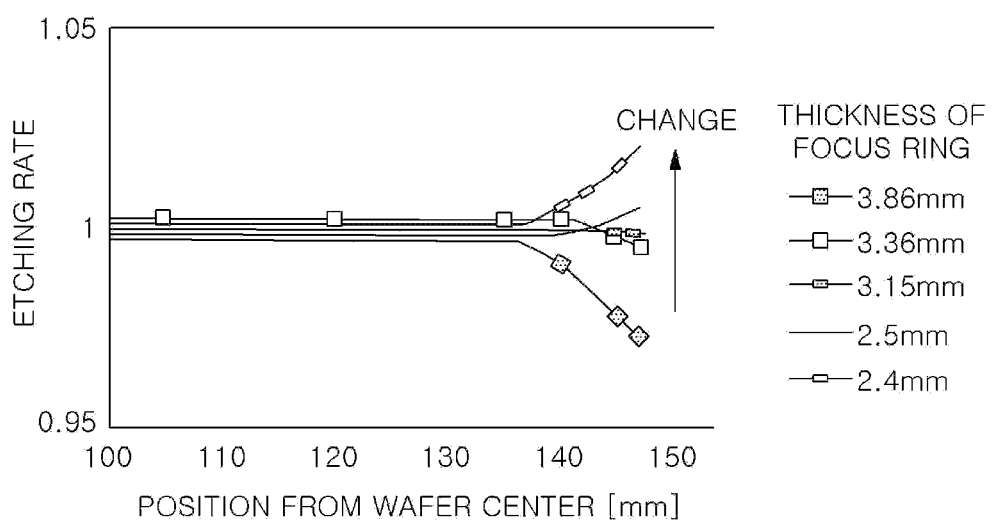
FIG. 11A shows an example of the relation between an etching rate and a thickness of a focus ring.

FIG. 11A shows an example of the relation between an etching rate and a thickness of the focus ring. FIG. 11A shows the etching rate measured by etching the wafer W while varying the thickness of the focus ring 5 and maintaining the height of the second mounting table 7 at a constant level. The size of the wafer W is set to 12 inches (diameter of 300 mm). FIG. 11A shows the changes in the etching rate with respect to the distance from the center of the wafer W for each thickness of the focus ring 5. The etching rate at the center of the wafer W is normalized as 1. As shown in FIG. 11A, the changes in the etching rate with respect to the changes in the thickness of the focus ring 5 are remarkable at the peripheral portion of the wafer W where the distance from the center of the wafer W is 135 mm or more.

Figure 11B:
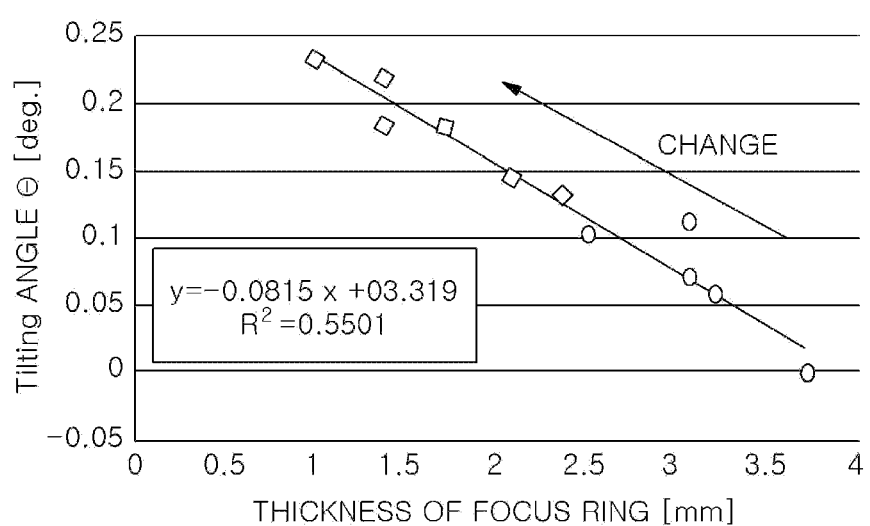
FIG. 11B shows an example of the relation between the angle θ of the etched hole and the thickness of the focus ring.

FIG. 11B shows an example of the relation between the angle θ of the etched hole and the thickness of the focus ring. FIG. 11B shows the angle θ of the hole (tilting angle θ) measured in the case of performing etching while varying the thickness of the focus ring 5 and maintaining the height of the second mounting table 7 at a constant level. FIG. 11B shows changes in the angle θ of the hole at a position separated by 135 mm from the center of the wafer W for each thickness of the focus ring 5. As shown in FIG. 11B, the changes in the tilting angle θ depending on the changes in the thickness of the focus ring 5 are remarkable at the peripheral portion of the wafer W.

Therefore, in the plasma processing apparatus 10 of the present embodiment, the elevation mechanism 120 is controlled in response to the state of the wafer W as the plasma processing target.

Referring back to FIG. 6, the acquisition unit 161*a* acquires the state information 163*a* of the wafer W as the plasma processing target. For example, the acquisition unit 161*a* reads out and acquires the state information 163*a* of the wafer W as the plasma processing target from the storage unit 163. The state information 163*a* includes data of the thickness of the wafer W at each position in the circumferential direction of the wafer W which corresponds to the arrangement position of the measuring unit 110 and the elevation mechanism 120. In the present embodiment, the state information 163*a* is previously stored in the storage unit 163. However, when the state information 163*a* is stored in another device, the acquisition unit 161*a* may acquire the state information 163*a* via a network.

The acquisition unit 161*a* acquires data of the height of the upper surface of the focus ring 5 by controlling the measurement control unit 114 to measure the height of the upper surface of the focus ring 5 at a plurality of positions in the circumferential direction of the focus ring 5 by using the respective measuring units 110. It is preferable to measure the height of the focus ring 5 when a temperature in the processing chamber 1 is stabilized at a level at which plasma processing is performed. The height of the focus ring 5 may be measured multiple times at a regular interval during the etching of a single wafer W, or may be performed once for a single wafer W.

The calculation unit 161*b* calculates the height of the focus ring 5 at which the positional relation satisfies a predetermined distance based on the state of the wafer W which is indicated by the state information 163*a* acquired by the acquisition unit 161*a* and the height of the upper surface of the focus ring 5 which is measured by the measuring unit 110. For example, the calculation unit 161*b* calculates an error in the thickness of the wafer W with respect to the standard thickness of the wafer W at each position in the circumferential direction of the wafer W from the data of the thickness of the wafer W at each position in the circumferential direction of the wafer W. For example, when the wafer size is 12 inches, the calculation unit 161*b* calculates an error in the thickness of the wafer W with respect to the standard thickness (0.775 mm). For example, when the actual thickness of the wafer W is 0.780 mm, the error in the thickness of the wafer W with respect to the standard thickness (0.775 mm) which is calculated by the calculation unit 161*b* is 0.005 mm. The calculation unit 161*b* calculates, for each position in the circumferential direction, the height of the focus ring 5 at which the positional relation between the upper surface of the wafer W and the upper surface of the focus ring 5 satisfies a predetermined distance. For example, a test or the like is conducted to obtain in advance the condition of the positional relation between the upper surface of the wafer W and the upper surface of the focus ring 5 in which the angle θ of the etched hole is within a predetermined allowable range. The condition of the positional relation between the upper surface of the wafer W and the upper surface of the focus ring 5 may be stored as the condition information in the storage unit 163. The calculation unit 161*b* may read out the condition of the positional relation from the condition information. Further, the condition of the positional relation between the upper surface of the wafer W and the upper surface of the focus ring 5 may be set for each etching condition such as a type of an etching gas, a material of the wafer W or the like and stored in the condition information. The calculation unit 161*b* may read out the condition of the positional relation which corresponds to the condition of the etching to be performed from the condition information. In the present embodiment, when the height of the upper surface of the wafer W is the same as the height of the upper surface of the focus ring 5, the angle θ of the etched hole is within an allowable range. In this case, the calculation unit 161*b* calculates the height of the focus ring 5 to be the same as the height of the wafer W. For example, in the plasma processing apparatus 10, when the focus ring 5 is new and the wafer W has a standard thickness, the standard height of the second mounting table 7 is designed such that the height of the upper surface of the wafer W mounted on the first mounting table 2 becomes the same as the height of the upper surface of the focus ring 5 mounted on the second mounting table 7. In this case, the calculation unit 161*b* corrects the height of the second mounting table 7 by the error in the thickness of the wafer W with respect to the standard height of the second mounting table 7. For example, when the error in the thickness of the wafer W is 0.005 mm, the calculation unit 161*b* adds 0.005 mm to the standard height of the second mounting table 7. The calculation unit 161*b* calculates, for each position in the circumferential direction of the wafer W which corresponds to the arrangement position of the measuring unit 110 and the elevation mechanism 120, the height of the second mounting table 7 at which the positional relation between the upper surface of the wafer W and the upper surface of the focus ring 5 satisfies a predetermined distance.

The elevation control unit 161c vertically moves the focus ring 5 by vertically moving the second mounting table 7 to the height calculated by the calculation unit 161b by controlling the elevation mechanism 120. For example, the elevation control unit 161c vertically moves each elevation mechanism 120 to the height of the second mounting table 7 which is calculated by the calculation unit 161b to correspond to the arrangement position of the corresponding elevation mechanism 120.

Accordingly, in the plasma processing apparatus 10, the height of the upper surface of the wafer W becomes the same as the height of the upper surface of the focus ring 5, which makes it possible to suppress the variation in the etching characteristics of each wafer W.

Figure 12:
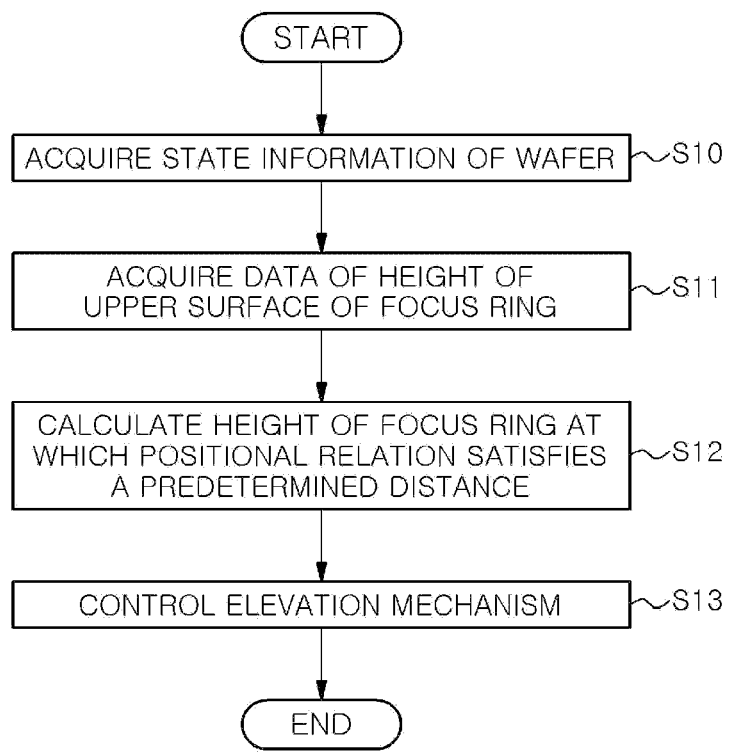
FIG. 12 is a flowchart of a process of controlling vertical movement of a focus ring.

Next, the process of controlling vertical movement of the focus ring by using the plasma processing apparatus 10 according to the first embodiment will be described. FIG. 12 is a flowchart of a process of controlling vertical movement of the focus ring. The process of controlling vertical movement of the focus ring is performed at a predetermined timing, e.g., when the wafer W is mounted on the first mounting table 2 and a temperature in the processing chamber 1 is stabilized at a level at which the plasma processing is performed. Alternatively, the process of controlling the vertical movement of the focus ring may be performed when the wafer W is mounted on the first mounting table 2.

As shown in FIG. 12, the acquisition unit 161a acquires the state information 163a of the wafer W as the plasma processing target (step S10). The acquisition unit 161a acquires the data of the height of the upper surface of the focus ring 5 by controlling the measurement control unit 114 to measure the height of the upper surface of the focus ring 5 at a plurality of positions in the circumferential direction of the focus ring 5 by using the respective measuring units 110 (step S11).

The calculation unit 161b calculates the height of the focus ring 5 at which the positional relation satisfies a predetermined distance based on the state of the wafer W indicated by the acquired state information 163a and the measured height of the upper surface of the focus ring 5 (step S12).

The elevation control unit 161c vertically moves each elevation mechanism 120 to the height of the second mounting table 7 which is calculated by the calculation unit 161b to correspond to the arrangement position of the corresponding elevation mechanism 120 (step S13), and the processing is terminated.

Figure 13:
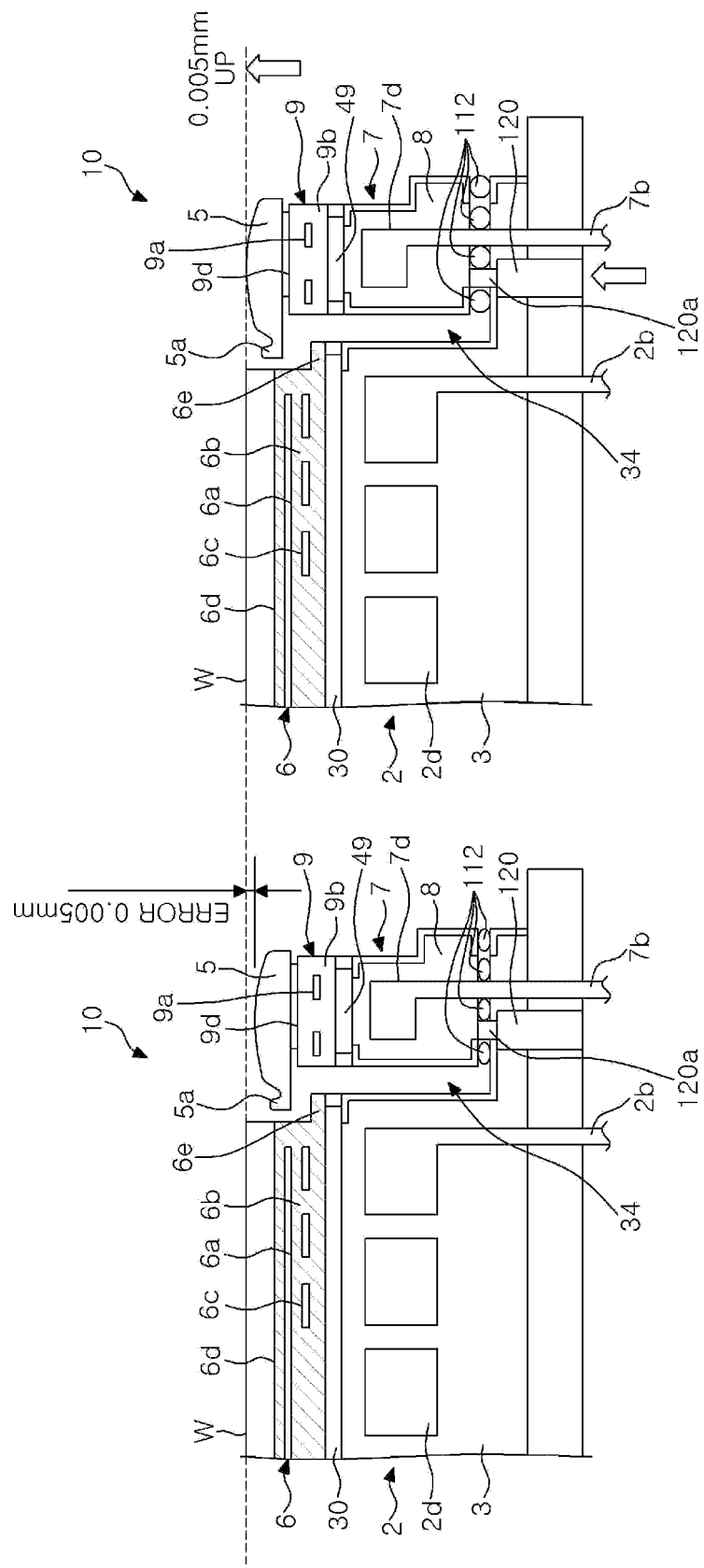
FIGS. 13A and 13B explain an example of a process of raising the second mounting table.

Next, a specific example will be described. FIGS. 13A and 13B explain an example of a process of vertically moving the second mounting table.

For example, as shown in FIG. 13A, the wafer W mounted on the first mounting table 2 has a thickness error of 0.005 mm, and the upper surface of the wafer W is higher than the upper surface of the focus ring 5 by 0.005 mm. In this case, in the plasma processing apparatus 10, the second mounting table 7 is raised by 0.005 mm as shown in FIG. 13B. Accordingly, the height of the upper surface of the wafer W can be the same as the height of the upper surface of the focus ring 5.

The consumption amount of the focus ring 5 may vary in the circumferential direction of the second mounting table 7. As shown in FIG. 3, in the plasma processing apparatus 10, three or more pairs of the measuring unit 110 and the elevation mechanism 120 are provided; the consumption amount of the focus ring 5 at each arrangement position is specified; and the second mounting table 7 is raised by a distance corresponding to the consumption amount by controlling the elevation mechanism 120. Accordingly, the plasma processing apparatus 10 can align the position of the upper surface of the focus ring 5 with the upper surface of the wafer W in the circumferential direction. As a result, the plasma processing apparatus 10 can maintain the uniformity of etching characteristic in the circumferential direction.

As described above, the plasma processing apparatus 10 according to the first embodiment includes the first mounting table 2, the elevation mechanism 120, the acquisition unit 161a, the calculation unit 161b, and the elevation control unit 161c. The first mounting table 2 mounts thereon the wafer W as the plasma processing target. The elevation mechanism 120 vertically moves the focus ring surrounding the wafer W. The acquisition unit 161a acquires the state information 163a indicating the measured state of the wafer W. The calculation unit 161b calculates the height of the focus ring 5 at which the positional relation between the upper surface of the wafer W and the upper surface of the focus ring 5 satisfies a predetermined distance based on the state of the wafer W indicated by the acquired state information 163a. The elevation control unit 161c controls the elevation mechanism 120 to vertically move the focus ring 5 to the calculated height. Accordingly, the plasma processing apparatus 10 can suppress the variation in the etching characteristics of each wafer W. Particularly, the plasma processing apparatus 10 can suppress the variation in the etching characteristics of each wafer W even at the peripheral portion of the wafer W which is easily affected by the variation in the state of the wafer W. Further, even in the case of etching a hole having a high aspect ratio, the plasma processing apparatus 10 can perform etching while suppressing the deviation amount between the position of the hole on the top surface and the position of the hole on the bottom surface in each wafer W.

In the plasma processing apparatus 10 according to the first embodiment, the state of the wafer W includes the thickness of the wafer W. Therefore, the plasma processing apparatus 10 can suppress the variation in the etching characteristics of each wafer W even when there is an error in a thickness of each wafer.

Further, the plasma processing apparatus 10 according to the first embodiment further includes the measuring unit 110. The measuring unit 110 measures the height of the upper surface of the focus ring 5. The calculation unit 161b calculates the height of the focus ring 5 at which the positional relation satisfies a predetermined distance based on the state of the wafer W and the measured height of the upper surface of the focus ring 5. Accordingly, in the plasma processing apparatus 10, even when the height of the upper surface of the focus ring 5 is changed due to consumption or the like, the positional relation between the upper surface of the wafer W and the upper surface of the focus ring 5 can satisfy a predetermined distance and, further, the variation in the etching characteristics can be suppressed.

In the plasma processing apparatus 10 according to the first embodiment, the elevation mechanism 120 is provided at a plurality of positions in the circumferential direction of the focus ring 5. The state information 163a includes the state measurement results obtained at a plurality of positions in the circumferential direction of the wafer W. The calculation unit 161b calculates, for each of the plurality of positions in the circumferential direction of the focus ring 5, the height of the focus ring 5 at which the positional relation between the upper surface of the wafer W and the upper surface of the focus ring 5 satisfies a predetermined distance based on the state measurement results obtained at the plurality of positions which are indicated by the state information 163a. The elevation control unit 161c controls each elevation mechanism 120 to vertically move the focus ring 5 to the calculated height. Accordingly, the plasma processing apparatus 10 can align the height of the upper surface of the focus ring 5 with respect to the upper surface of the wafer W in the circumferential direction. As a result, the plasma processing apparatus 10 can maintain the uniformity of the etching characteristics in the circumferential direction.

Second Embodiment

Next, a second embodiment will be described. Since the plasma processing apparatus 10 according to the second embodiment has the same configuration as that of the plasma processing apparatus 10 according to the first embodiment shown in FIGS. 1 to 3, the description thereof will be omitted.

Figure 14:
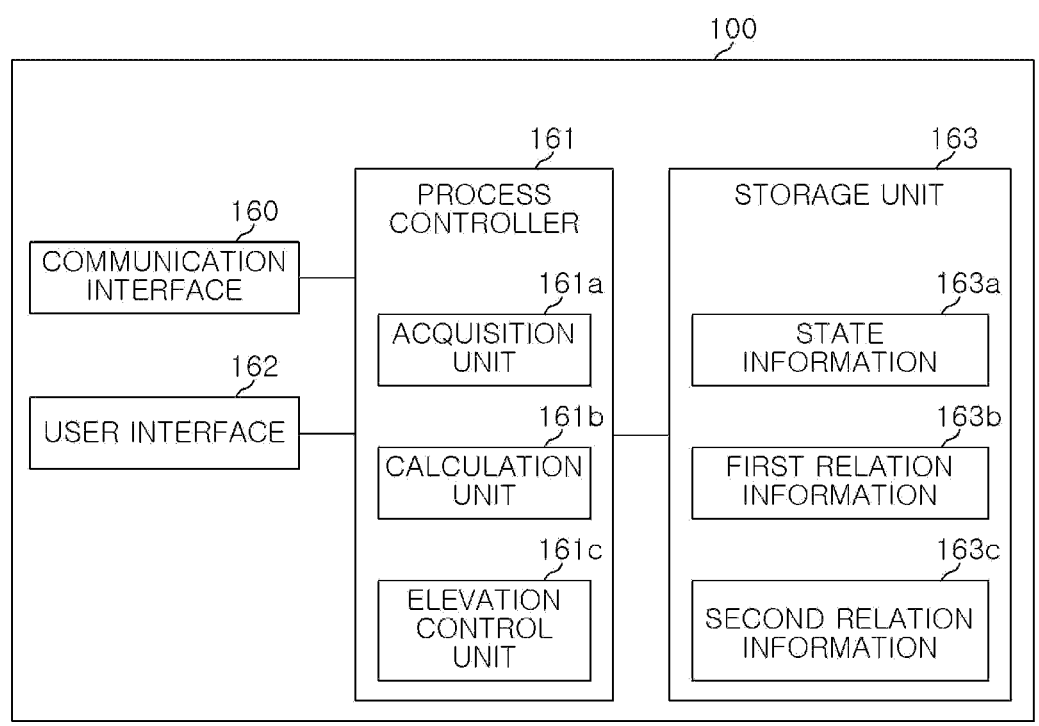
FIG. 14 is a block diagram showing a schematic configuration of a control unit for controlling a plasma processing apparatus according to a second embodiment.

The control unit 100 according to the second embodiment will be described in detail. FIG. 14 is a block diagram showing a schematic configuration of the control unit for controlling the plasma processing apparatus according to the second embodiment. Since the control unit 100 according to the second embodiment has substantially the same configuration as that of the control unit 100 according to the first embodiment shown in FIG. 6, like reference numerals will be given to like parts and redundant description thereof will be omitted. Only the differences will be mainly described.

The storage unit 163 stores therein the state information 163a, first relation information 163b, and second relation information 163c.

The state information 163a includes the thickness and the outer diameter of the wafer W which are measured at a plurality of positions in the circumferential direction of the wafer W.

Although the outer diameter such as the diameter or the like of the wafer W is determined according to the standards as shown in FIG. 9, a certain error is allowed. In the plasma processing apparatus 10, the height position of the plasma sheath above the focus ring 5 is deviated from the height position of the plasma sheath above the wafer W due to the variation in the outer diameter of the wafer W and, thus, the etching characteristics are changed. Particularly, the peripheral portion of the wafer W is easily affected by the etching result including the variation in the etching rate and the shape abnormality such as tilting or the like due to the variation in the outer diameter of the wafer W.

Figure 15A:
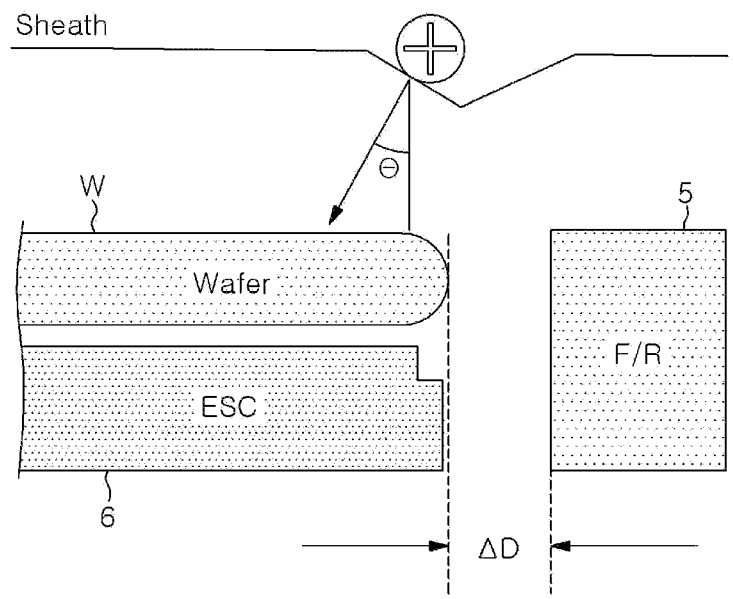
FIG. 15A schematically shows a state of a plasma sheath in the case where a wafer has a small outer diameter.

FIG. 15A schematically shows the state of the plasma sheath when the wafer has a small outer diameter. When the outer diameter of the wafer W is small, as shown in FIG. 15A, a distance ΔD between the wafer W and the focus ring 5 is increased. As a result, the inclination of the plasma sheath at the peripheral portion of the wafer W is increased, and the incident angle θ at which the positive charges of the ions are incident on the wafer W is increased at the peripheral portion of the wafer W.

Figure 15B:
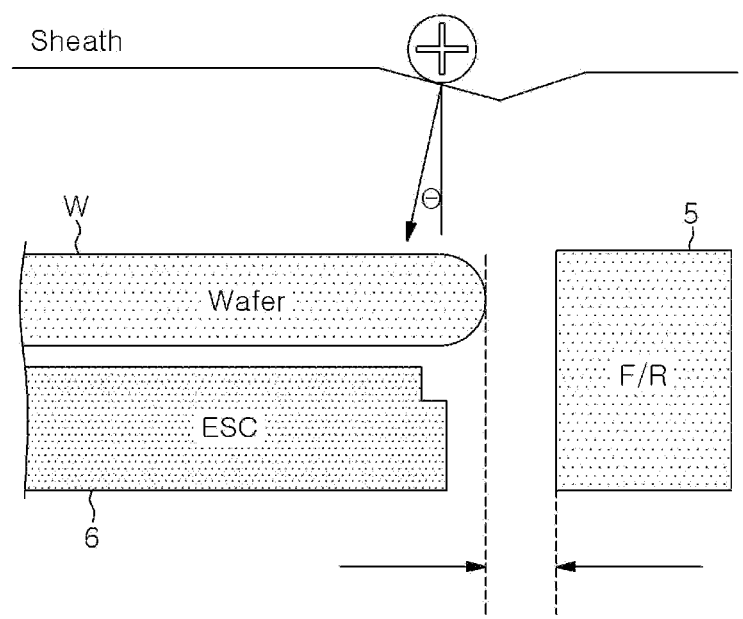
FIG. 15B schematically shows a state of a plasma sheath in the case where a wafer has a large outer diameter.

FIG. 15B schematically shows the state of the plasma sheath when the wafer has a large outer diameter. When the outer diameter of the wafer W is large, as shown in FIG. 15B, the distance ΔD between the wafer W and the focus ring 5 is decreased. As a result, the inclination of the plasma sheath at the peripheral portion of the wafer W is decreased, and the incident angle θ at which the positive charges of the ions are incident on the wafer W is decreased at the peripheral portion of the wafer W.

As described above, in the plasma processing apparatus 10, the etching characteristics are changed due to the changes in the incident angle of the positive charges of the ions. For example, the shape abnormality such as tilting or the like occurs in the hole being etched.

Figure 16:
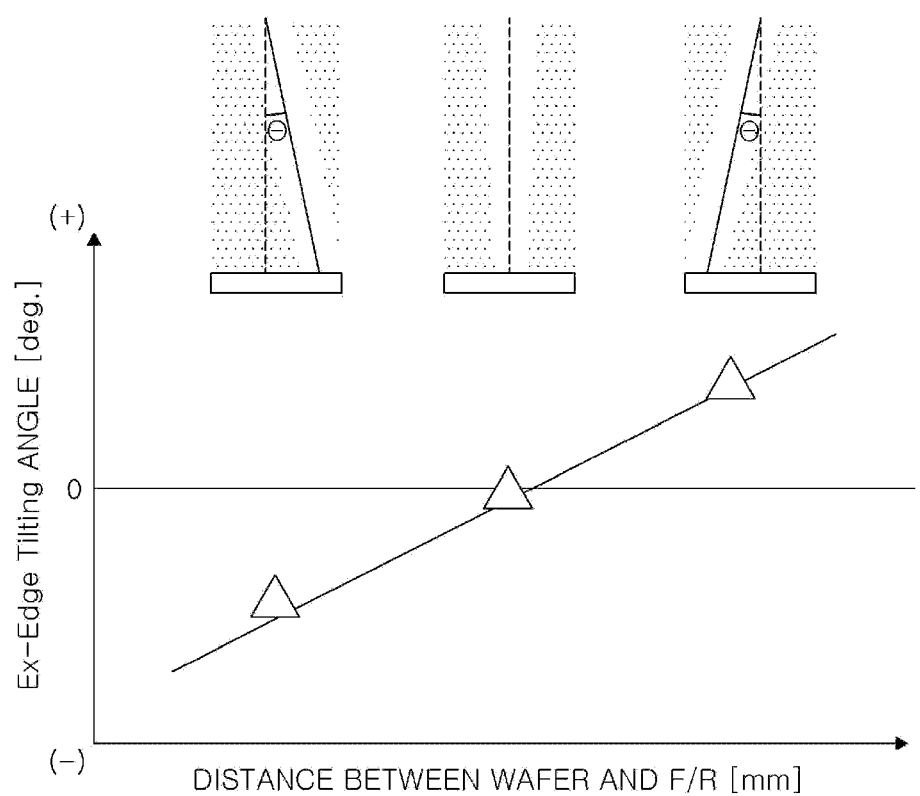
FIG. 16 shows an example of the relation between the angle θ of the etched hole and the thickness of the focus ring.

FIG. 16 shows an example of the relation between the angle θ of the etched hole and the thickness of the focus ring. FIG. 16 shows the angle θ of the hole (tilting angle θ) measured in the case of performing etching while varying the distance between the wafer W and the focus ring 5. FIG. 16 shows the tilting angle θ of the peripheral portion of the wafer W with respect to the distance between the wafer W and the focus ring (F/R) 5.

As shown in FIG. 16, the tilting angle θ varies depending on the distance between the wafer W and the focus ring 5. As described in the first embodiment with reference to FIG. 8B and the like, the tilting angle θ also varies depending on the height of the upper surface of the focus ring 5 with respect to the upper surface of the wafer W.

Therefore, the relation between the variation in the tilting angle θ with respect to the distance between the wafer W and the focus ring 5 is obtained in advance by conducting, e.g., a test or the like. Further, the relation between the variation in the tilting angle θ with respect to the height difference between the upper surface of the wafer W and the upper surface of the focus ring 5 is obtained in advance.

The relation between the tilting angle θ and the distance between the wafer W and the focus ring 5 is stored in the first relation information 163b. Further, the relation between the tilting angle θ and the height difference between the upper surface of the wafer W and the upper surface of the focus ring 5 is stored in the second relation information 163c. The first relation information 163b may be information on an equation for calculating the tilting angle θ from the distance between the wafer W and the focus ring 5, or may be a table in which the distance between the wafer W and the focus ring 5 is correlated with the tilting angle θ. The second relation information 163c may be information on an equation for calculating the tilting angle θ from the height difference between the upper surface of the wafer W and the upper surface of the focus ring 5, or may be a table in which the tilting angle θ is correlated with the height difference between the upper surface of the wafer W and the upper surface of the focus ring 5.

The acquisition unit 161a acquires the state information 163a of the wafer W as the plasma processing target. For example, the acquisition unit 161a reads out and acquires the state information 163a of the wafer W as the plasma processing target from the storage unit 163. The state information 163a includes data of the thickness and the outer diameter of the wafer W at each position in the circumferential direction of the wafer W which corresponds to the arrangement position of the measuring unit 110 and the elevation mechanism 120.

The calculation unit 161b calculates the height of the focus ring 5 at which the positional relation satisfies a predetermined distance based on the state of the wafer W which is indicated by the state information 163a acquired by the acquisition unit 161a and the height of the upper surface of the focus ring 5 which is measured by the measuring unit 110. For example, the calculation unit 161b calculates, for each position in the circumferential direction of the wafer W, an error in the thickness of the wafer W with respect to the standard thickness of the wafer W from the data of the thickness of the wafer W at each position in the circumferential direction of the wafer W. Further, the calculation unit 161b calculates, for each position in the circumferential direction, the height of the focus ring 5 at which the positional relation between the upper surface of the wafer W and the upper surface of the focus ring 5 satisfies a predetermined distance.

Further, the calculation unit 161b calculates an error in the outer diameter of the wafer W with respect to a standard diameter of the wafer for each position in the circumferential direction from the data of the outer diameter of the wafer W at each position in the circumferential direction of the wafer W. For example, when the wafer size is 12 inches, the calculation unit 161b calculates an error in the outer diameter of the wafer W with reference to the outer radius (150 mm) of the wafer having a standard diameter (300 mm). The calculation unit 161b obtains a tilting angle θ caused by an error in the outer diameter of the wafer W by using the first relation information 163b. Further, the calculation unit 161b obtains a height difference between the upper surface of the focus ring 5 and the upper surface of the wafer W which corresponds to the tilting angle θ caused by the error in the outer diameter of the wafer W by using the second relation information 163c. In other words, the calculation unit 161b calculates the height difference between the upper surface of the wafer W and the upper surface of the focus ring 5 which is required to cancel the tilting angle θ caused by the error in the outer diameter of the wafer W. The height difference between the upper surface of the wafer W and the upper surface of the focus ring 5 becomes a correction amount of the height of the second mounting table 7. For example, when the tilting angle θ caused by the error in the outer diameter of the wafer W is 0.05 [deg], the calculation unit 161b obtains the correction amount of the height of the second mounting table 7 which is required to change the tilting angle θ by −0.05 [deg] by using the second relation information 163c. For example, when the tilting angle at the standard diameter is $\theta_0$ and the tilting angle at the actual outer diameter of the wafer W is $\theta_1$, the calculation unit 161b obtains the tilting angle caused by the error in the outer diameter of the wafer W by calculating $\theta_0 - \theta_1$. For example, when a conversion rate for canceling the tilting angle θ is $\theta_r$, the calculation unit 161b obtains the correction amount of the height of the second mounting table 7 by calculating $(\theta_0 - \theta_1)/\theta_r$.

Then, the calculation unit 161b calculates a final height of the second mounting table 7 by correcting the height of the focus ring 5 at which the positional relation between the upper surface of the wafer W and the upper surface of the focus ring 5 satisfies a predetermined distance by the correction amount of the height of the second mounting table 7.

The elevation control unit 161c vertically moves the focus ring 5 by vertically moving the second mounting table 7 to the final height calculated by the calculation unit 161b by controlling each elevation mechanism 120. For example, the elevation control unit 161c vertically moves each elevation mechanism 120 to the final height of the second mounting table 7 which is calculated by the calculation unit 161b to correspond to the arrangement position of the corresponding elevation mechanism 120.

Accordingly, in the plasma processing apparatus 10, the tilting angle caused by the error in the outer diameter of the wafer W can be corrected, which makes it possible to suppress the variation in the etching characteristics of each wafer W.

As described above, in the plasma processing apparatus according to the second embodiment, the state of the wafer W includes the thickness of the wafer W and the outer diameter of the wafer W. As a result, the plasma processing apparatus 10 can suppress the variation in the etching characteristics of each wafer W even when there is an error in a thickness and an outer diameter of each wafer W.

While various embodiments have been described, various modifications can be made without being limited to the above-described embodiments. For example, although the above-described plasma processing apparatus 10 is a capacitively coupled plasma processing apparatus 10, any plasma processing apparatus 10 may be employed. For example, the plasma processing apparatus 10 may be any plasma processing apparatus 10, such as an inductively coupled plasma processing apparatus 10 or a plasma processing apparatus 10 for exciting a gas by a surface wave such as a microwave.

Further, in the above-described embodiment, the case in which the focus ring 5 is vertically moved by vertically moving the second mounting table 7 by the elevation mechanism 120 has been described as an example. However, the present disclosure is not limited thereto. For example, only the focus ring 5 may be vertically moved by pins or the like penetrating through the second mounting table 7.

In the second embodiment, the case in which the focus ring 5 is vertically moved depending on both of the thickness and the outer diameter of the wafer W has been described as an example. However, the present disclosure is not limited thereto. For example, the focus ring 5 may be vertically moved depending on only the outer diameter of the wafer W.

Further, in the above-described embodiment, the state of the wafer W includes the thickness and the outer diameter of the wafer W thereof. However, the present disclosure is not limited thereto. For example, the state of the wafer W may be the shape of the end portion (wafer bevel portion) of the wafer W, the type of the film formed or remaining on the backside of the wafer W, the film thickness, the eccentricity of the wafer W, the warpage of the wafer W, or the like. For example, it is possible to store the relation between the tilting angle θ with respect to each state of the wafer W as the relation information and obtain the height difference between the upper surface of the wafer W and the upper surface of the focus ring 5 which is required to cancel the tilting angle θ caused by the actual state of the wafer W. For example, the tilting angle θ is stored as the relation information for each shape of the end portion of the wafer W. Further, the shape of the end portion of the actual wafer W as the plasma processing target is measured. It is also possible to obtain the tilting angle θ caused by the actual state of the wafer W and obtain the height difference between the upper surface of the wafer W and the upper surface of the focus ring 5 which is required to cancel the obtained tilting angle θ.

Although the second embodiment has described the case in which the correction amount of the height of the second mounting table 7 with respect to the distance between the wafer W and the focus ring 5 is obtained by using the first relation information 163b and the second relation information 163c, the present disclosure is not limited thereto. For example, the correction amount of the height of the second mounting table 7 with respect to the distance between the wafer W and the focus ring 5 may be stored as the relation information by integrating the first relation information 163b and the second relation information 163c.

In the plasma processing apparatus 10, when multiple types of plasma etching processes are performed on a single wafer W, it is possible to vertically move the second mounting table 7 and change the position of the focus ring 5 with respect to the wafer W so that the variation in etching characteristics of each plasma process can be suppressed.

While the present disclosure has been shown and described with respect to the embodiments, it will be understood by those skilled in the art that various changes and modifications may be made without departing from the scope of the present disclosure as defined in the following claims.

What is claimed is:

1. A plasma processing apparatus comprising:
   a chamber;
   a first mounting table, the first mounting table including a first base, an electrostatic chuck on the first base, and a substrate mounting surface on a top of the first mounting table, wherein a substrate is mounted on the substrate mounting surface;
   a focus ring arranged to surround the substrate mounting surface;
   a second mounting table, the second mounting table including a second base different from the first base and a focus ring mounting surface on a top of the second mounting table, the focus ring mounted on the focus ring mounting surface;
   an elevation mechanism configured to vertically move the second base, the elevation mechanism including at least one actuator and at least one rod which connects the second base and the at least one actuator;
   a measuring unit configured to acquire data of a height of an upper surface of the focus ring at a plurality of positions in a circumferential direction of the focus ring; and
   a controller which includes an acquisition unit and a calculation unit,
   wherein the acquisition unit is configured to acquire state information including data of a thickness of the substrate at each of a plurality of positions in a circumferential direction of the substrate, and
   the calculation unit is configured to calculate a calculated height of the focus ring at which a positional relation between an upper surface of the substrate and the upper surface of the focus ring satisfies a predetermined distance for each of the plurality of positions in the circumferential direction of the substrate and the focus ring based on the state information of the substrate acquired by the acquisition unit and the data of the height of the focus ring acquired by the measuring unit,
   wherein the controller is configured to control the plasma processing apparatus to:
   (a) acquire, by the acquisition unit, the state information of the substrate at the plurality of different circumferential positions of the substrate;
   (b) acquire, by the measuring unit, the data of the height of the focus ring at the plurality of different circumferential positions of the focus ring;
   (c) calculate, by the calculating unit, the calculated height of the focus ring based on the state information at the plurality of different circumferential positions of the substrate and the height information at the plurality of different circumferential positions of the focus ring; and
   (d) vertically move, by the elevation mechanism, the second base to move the focus ring to the calculated height.

2. The plasma processing apparatus according to claim 1, wherein the controller includes a storage unit which stores the state information, and the acquisition unit is configured to receive the state information from the storage unit.

3. The plasma processing apparatus according to claim 1, wherein the acquisition unit is connected to a network and the acquisition unit is configured to receive the state information from the network.

4. The plasma processing apparatus according to claim 1, wherein the controller is configured to:
   control the plasma processing apparatus to be at a processing temperature; and
   perform (b) with the plasma processing apparatus at the processing temperature.

5. The plasma processing apparatus according to claim 4, wherein the controller is configured to perform (b) once during plasma processing of one substrate.

6. The plasma processing apparatus according to claim 4, wherein the controller is configured to perform (b) a plurality of times during processing of one substrate.

7. The plasma processing apparatus according to claim 1, wherein the first base includes a flange, and the second base is supported on the flange.

8. The plasma processing apparatus according to claim 1, wherein the first base includes a flange, and the at least one rod and an O-ring support the second base on the flange, and
   wherein the O-ring is between a top surface of the flange and a bottom surface of the second base.

9. The plasma processing apparatus according to claim 1, wherein the second mounting table includes at least one through hole extending vertically through the second mounting table;
   the measurement unit includes a measurement control unit, and the measurement control unit includes: a light source configured to emit a laser light, a light emitting part, and an optical fiber connecting the light emitting part and the light source, and
   wherein the light emitting part is positioned to direct the laser light through the at least one through hole and toward the focus ring.

10. The plasma processing apparatus according to claim 9, wherein the first base includes a flange, and the second base is positioned above the flange;
    a quartz window is mounted on the flange at a location vertically below the through hole; and
    the light emitting part is positioned below the quartz window in the flange.

11. The plasma processing apparatus according to claim 1, wherein the first mounting table includes a first coolant path and the second mounting table includes a second coolant path different from the first coolant path, the second coolant path including an inlet and an outlet, and
    a first flexible line is connected to the inlet of the second coolant path and a second flexible line is connected to the outlet of the second coolant path.

12. The plasma processing apparatus according to claim 1, wherein the second mounting table includes a focus ring heater, and the focus ring is positioned directly vertically above the focus ring heater.

13. The plasma processing apparatus according to claim 12, further including a sheet member positioned vertically between the focus ring and the focus ring heater.

14. The plasma processing apparatus according to claim 1, further including a flexible wiring electrically connecting the first mounting table and the second mounting table.

15. The plasma processing apparatus according to claim 1, wherein in (c), the calculation unit of the controller is configured to calculate the calculated height which reduces a height difference between the upper surface of the focus ring and an upper surface of the substrate based on the state information of the substrate acquired by the acquisition unit and the data of the height of the focus ring acquired by the measurement unit.

16. The plasma processing apparatus according to claim 1, wherein the controller is configured to control the calculation unit to determine the calculated height which reduces an inclination angle of holes formed in the substrate.

17. A plasma processing apparatus comprising:
a chamber;
a first mounting table, the first mounting table including a first base, an electrostatic chuck on the first base, and a substrate mounting surface on a top of the first mounting table, wherein a substrate is mounted on the substrate mounting surface;
a focus ring arranged to surround the substrate mounting surface;
an elevation mechanism configured to vertically move the focus ring, the elevation mechanism including at least one actuator and at least one rod which is connected to the at least one actuator;
a measuring unit configured to acquire data of a height of an upper surface of the focus ring at a plurality of positions in a circumferential direction of the focus ring; and
a controller which includes an acquisition unit and a calculation unit,
wherein the acquisition unit is configured to acquire state information including data of at least one of: a thickness of the substrate at each of a plurality of positions in a circumferential direction of the substrate, a shape of an end portion of the substrate, a type or thickness of deposits on a back surface of the substrate, an eccentricity of the substrate, and a warpage of the substrate, and
the calculation unit is configured to calculate a calculated height of the focus ring at which a positional relation between an upper surface of the substrate and the upper surface of the focus ring satisfies a predetermined distance for each of the plurality of positions in the circumferential direction of the substrate and the focus ring based on the state information of the substrate acquired by the acquisition unit and the data of the height of the focus ring acquired by the measuring unit,
wherein the controller is configured to control the plasma processing apparatus to:
(a) acquire, by the acquisition unit, the state information of the substrate;
(b) acquire, by the measuring unit, the data of the height of the focus ring;
(c) calculate, by the calculating unit, the calculated height of the focus ring; and
(d) vertically move, by the elevation mechanism, the focus ring to move the focus ring to the calculated height.

18. A plasma processing method comprising:
providing a plasma processing apparatus which includes:
a chamber;
a first mounting table, the first mounting table including a first base, an electrostatic chuck on the first base, and a substrate mounting surface on a top of the first mounting table;
a focus ring arranged to surround the substrate mounting surface;
a second mounting table, the second mounting table including a second base different from the first base and a focus ring mounting surface on a top of the second mounting table, the focus ring mounted on the focus ring mounting surface;
an elevation mechanism configured to vertically move the second base, the elevation mechanism including at least one actuator and at least one rod which connects the second base and the at least one actuator;
a measuring unit configured to acquire data of a height of an upper surface of the focus ring at a plurality of positions in a circumferential direction of the focus ring; and
a controller which includes an acquisition unit and a calculation unit,
wherein the acquisition unit is configured to acquire state information including data of a thickness of the substrate at each of a plurality of positions in a circumferential direction of the substrate, and
the calculation unit is configured to calculate a calculated height of the focus ring at which a positional relation between an upper surface of the substrate and the upper surface of the focus ring satisfies a predetermined distance for each of the plurality of positions in the circumferential direction of the substrate and the focus ring based on the state information of the substrate and the data of the height of the focus ring acquired by the measuring unit,
the method further comprising:
placing the substrate on the substrate mounting surface; and
using the controller to control the plasma processing apparatus to:
(a) acquire, by the acquisition unit, the state information of the substrate placed on the substrate mounting surface;
(b) acquire, by the measuring unit, the data of the height of the focus ring;
(c) calculate, by the calculating unit, the calculated height of the focus ring; and
(d) vertically move, by the elevation mechanism, the focus ring to the calculated height.

* * * * *